(12) United States Patent
Carlson et al.

(10) Patent No.: US 9,513,172 B2
(45) Date of Patent: Dec. 6, 2016

(54) WAFER LEVEL PACKAGING OF INFRARED CAMERA DETECTORS

(71) Applicant: FLIR Systems, Inc., Wilsonville, OR (US)

(72) Inventors: Gregory A. Carlson, Goleta, CA (US); Alex Matson, Goleta, CA (US); Andrew Sharpe, Solvang, CA (US); Davey Beard, Santa Barbara, CA (US); Paul Schweikert, Ventura, CA (US); Robert Simes, Santa Barbara, CA (US)

(73) Assignee: FLIR Systems, Inc., Wilsonville, OR (US)

(*) Notice: Subject to any disclaimer, the term of this patent is extended or adjusted under 35 U.S.C. 154(b) by 949 days.

(21) Appl. No.: 13/750,709

(22) Filed: Jan. 25, 2013

(65) Prior Publication Data

US 2016/0047691 A1 Feb. 18, 2016

Related U.S. Application Data

(63) Continuation of application No. PCT/US2011/045600, filed on Jul. 27, 2011.
(Continued)

(51) Int. Cl.
*G01J 5/10* (2006.01)
*G01J 5/04* (2006.01)
(Continued)

(52) U.S. Cl.
CPC ............... *G01J 5/10* (2013.01); *G01J 1/0204* (2013.01); *G01J 1/44* (2013.01); *G01J 5/02* (2013.01);
(Continued)

(58) Field of Classification Search
None
See application file for complete search history.

(56) References Cited

U.S. PATENT DOCUMENTS 4,900,257 A * 2/1990 Maeda .......................... 438/532
5,352,926 A 10/1994 Andrews
(Continued)

FOREIGN PATENT DOCUMENTS

EP 1816454 8/2007

OTHER PUBLICATIONS

Andrew Mawer, Plastic Ball Grid Array (PBGA), 1996, Motorola, AN1231, pp. 1-28.
(Continued)

*Primary Examiner* — Peter D Le
(74) *Attorney, Agent, or Firm* — Haynes and Boone, LLP

(57) ABSTRACT

An infrared detector useful in, e.g., infrared cameras, includes a substrate having an array of infrared detectors and a readout integrated circuit interconnected with the array disposed on an upper surface thereof, for one or more embodiments. A generally planar window is spaced above the array, the window being substantially transparent to infrared light. A mesa is bonded to the window. The mesa has closed marginal side walls disposed between an outer periphery of a lower surface of the window and an outer periphery of the upper surface of the substrate and defines a closed cavity between the window and the array that encloses the array. A solder seal bonds the mesa to the substrate so as to seal the cavity.

20 Claims, 31 Drawing Sheets

Related U.S. Application Data

(60) Provisional application No. 61/469,651, filed on Mar. 30, 2011.

(51) Int. Cl.
| | | |
|---|---|---|
| *H04N 5/225* | (2006.01) | |
| *H04N 5/33* | (2006.01) | |
| *G01J 5/02* | (2006.01) | |
| *G01J 5/20* | (2006.01) | |
| *G01J 1/02* | (2006.01) | |
| *G01J 1/44* | (2006.01) | |
| *H01L 27/146* | (2006.01) | |
| *G01J 5/00* | (2006.01) | |

(52) U.S. Cl.
CPC .............. *G01J 5/023* (2013.01); *G01J 5/0215* (2013.01); *G01J 5/046* (2013.01); *G01J 5/20* (2013.01); *H01L 27/146* (2013.01); *H01L 27/14687* (2013.01); *H04N 5/2251* (2013.01); *H04N 5/33* (2013.01); *G01J 2005/0077* (2013.01); *Y10T 29/49826* (2015.01)

(56) References Cited

U.S. PATENT DOCUMENTS

| | | | | |
|---|---|---|---|---|
| 5,420,419 | A | * | 5/1995 | Wood .................... 250/338.4 |
| 5,534,697 | A | | 7/1996 | Creekmore et al. |
| 5,640,045 | A | | 6/1997 | Krausse, III |
| 5,693,942 | A | * | 12/1997 | Endo et al. ............... 250/338.1 |
| 6,028,309 | A | | 2/2000 | Parrish et al. |
| 6,262,489 | B1 | | 7/2001 | Koors et al. |
| 6,667,543 | B1 | | 12/2003 | Chow et al. |
| 7,037,844 | B2 | | 5/2006 | Dache et al. |
| 7,084,010 | B1 | * | 8/2006 | Kennedy et al. ............ 438/115 |
| 7,402,802 | B1 | | 7/2008 | Terre et al. |
| 7,470,904 | B1 | | 12/2008 | Schweikert et al. |
| 7,709,935 | B2 | | 5/2010 | Islam et al. |
| 8,058,104 | B2 | | 11/2011 | Islam et al. |
| 2004/0023433 | A1 | * | 2/2004 | Erikson et al. ............... 438/106 |
| 2004/0101020 | A1 | | 5/2004 | Bhandarkar |
| 2004/0135912 | A1 | | 7/2004 | Hofflinger et al. |
| 2007/0065984 | A1 | | 3/2007 | Lau et al. |
| 2007/0138628 | A1 | | 6/2007 | Lam |
| 2008/0048120 | A1 | | 2/2008 | Gooch |
| 2009/0084958 | A1 | | 4/2009 | Vogt |
| 2009/0140125 | A1 | | 6/2009 | Takayama |
| 2009/0294957 | A1 | | 12/2009 | Lam |
| 2011/0049703 | A1 | | 3/2011 | Hsu et al. |
| 2011/0089462 | A1 | | 4/2011 | Van Heerden et al. |
| 2012/0026337 | A1 | | 2/2012 | Boulanger et al. |

OTHER PUBLICATIONS

Lapisa, at al., "Wafer-Level Heterogeneous Integration for MOEMS, MEMS, and NEMS", IEEE Journal of Selected Topics in Quantum Electronics, vol. 17, No. 3, May/Jun. 2011, pp. 629-644.

Zimmer, et al., "One-Megapixel Monocrystalline-Silicon Micromirror Array on CMOS Driving Electronics Manufactured With Very Large-Scale Heterogeneous Integration", Journal of Microelectromechanical Systems, vol. 20, No. 3, Jun. 2011, pp. 564-572.

Niklaus, et al., "Performance Model for Uncooled Infrared Bolometer Arrays and Performance Predictions of Bolometers Operating at Atmospheric Pressure", ScienceDirect, Infrared Physics & Technology 51 (2008) pp. 168-177.

Lapadatu, et al., "Cu—Sn Wafer Level Bonding for Vacuum Encapsulation of Microbolometer Focal Plane Arrays", Abstract #1693, 218th ECS Meeting, ©2010 The Electrochemical Society (1 page).

Ericsson, et al., "Towards 17 pm Pitch Heterogeneously integrated Si/SiGe Quantum Well Bolometer Focal Plane Arrays", Infrared Technology and Applications XXXVII, edited by Bjorn F. Andresen, et al., Proc. of SPIE vol. 6012, 801216, © 2011 SPIE, pp. 110.

\* cited by examiner

WAFER LEVEL PACKAGING OF INFRARED CAMERA DETECTORS

RELATED APPLICATIONS

This continuation patent application claims priority to and the benefit of PCT Patent Application No. PCT/US2011/045600 filed Jul. 27, 2011, which claims priority to and the benefit of U.S. Provisional Patent Application No. 61/469,651 filed Mar. 30, 2011, which are all incorporated by reference in their entirety. U.S. patent application Ser. No. 12/844,124 filed Jul. 27, 2010 is incorporated by reference in its entirety.

TECHNICAL FIELD

One or more embodiments of the invention relate generally to infrared cameras and, more particularly, to infrared detectors and other types of infrared camera architectures and systems and methods for manufacturing infrared camera architectures.

BACKGROUND

Thermal infrared cameras are well known and used in a wide variety of applications. A typical thermal infrared camera, often referred to simply as an infrared camera or IR camera, uses an infrared detector to detect infrared energy that is provided to the infrared detector through an infrared camera lens—a lens capable of transmitting infrared energy. The infrared camera may also include a display for a user to view images generated by the infrared camera based on the infrared energy, or the images may be stored by the infrared camera or transmitted (e.g., via a wireless or wired network) for remote viewing and/or storage.

A conventional infrared camera typically includes a large number of individual, non-integrated electronic components that require various printed circuit boards and power supply voltages to support these electrical components. The conventional infrared camera may also require an external heat sink or other type of external thermal management device to control temperature conditions associated with the infrared detector and other sensitive components of the infrared camera.

Furthermore, the conventional infrared camera may have cumbersome optical alignment procedures and/or complex calibration processes that may need to be performed by a user integrating the infrared camera into a desired system. Consequently, the conventional infrared camera may represent a device that is relatively expensive to manufacture and complex to integrate into a desired system. As a result, there is a need for an improved infrared camera architecture.

SUMMARY

Infrared camera architecture systems and methods are disclosed in accordance with one or more embodiments of the invention. For example, in accordance with one or more embodiments of the invention, an infrared camera architecture is disclosed that integrates various elements of an infrared camera, such as electronics, thermal management, and/or optical alignment, into a single package that may be manufactured using high volume manufacturing processes. This infrared camera architecture, for one or more embodiments of the invention, may offer an elegant solution (e.g., relative to conventional, complex infrared camera alternatives) that may be easily designed into various products by system engineers without the usual complexity and without the need for in-depth, infrared domain knowledge.

More specifically, in accordance with one embodiment of the invention, an infrared camera includes an infrared detector; a substrate; a plurality of electrical components coupled to the substrate; a pedestal made of a thermally conductive material and having a leg coupled to the substrate, wherein the infrared detector is supported by and thermally coupled to the pedestal, the pedestal thermally isolating the infrared detector from the plurality of electrical components; and a core housing coupled to the infrared detector, the substrate, the pedestal, and the plurality of electrical components to form an infrared camera core.

In accordance with another embodiment of the invention, an infrared camera includes an infrared detector adapted to capture infrared images; a pedestal coupled to the infrared detector and having an infrared detector alignment feature; a substrate coupled to the pedestal; a die stack coupled to the substrate, wherein the pedestal is configured to thermally protect the infrared detector from the die stack; an infrared camera core housing configured to at least partially house the infrared detector, the pedestal, the substrate, and the die stack to form an infrared camera core; a camera housing having an optical alignment feature within the camera housing and at least partially enclosing the infrared camera core; and a lens within the camera housing; wherein the optical alignment feature and the infrared detector alignment feature are coupled to provide optical alignment of the infrared detector with the lens.

In accordance with another embodiment of the invention, a method of assembling an infrared camera includes mounting a die stack to a substrate; securing a pedestal to the substrate and above the die stack, the pedestal made of a thermally conductive material; adhering an infrared detector to the pedestal, wherein the pedestal is configured to thermally isolate the infrared detector from the die stack; and encapsulating at least partially the substrate, the die stack, the pedestal, and the infrared detector in a core housing to form an infrared camera core.

In accordance with another embodiment of the invention, infrared detectors for infrared camera architecture systems and methods are provided, together with methods for producing them reliably and efficiently in volume quantities using wafer level packaging (WLP) techniques. More specifically, in accordance with one embodiment of the invention, an infrared detector includes a substrate having an array of infrared detectors (e.g., microbolometers) and a readout integrated circuit interconnected with the array disposed on an upper surface thereof. A generally planar window is spaced above the array, the window being substantially transparent to infrared light. A mesa is bonded to the window. The mesa has closed marginal side walls disposed between an outer periphery of a lower surface of the window and an outer periphery of the upper surface of the substrate and defines a closed cavity between the window and the substrate that encloses the array. The mesa is bonded to the substrate (e.g., by way of a solder seal) so as to seal the cavity.

In accordance with another embodiment of the invention, a method for making an infrared detector includes providing a window wafer having a layer of oxide sandwiched between two layers of a semiconductor. An array of cavities is formed in a surface of the window wafer. In various embodiments, the cavity depth is defined by the positioning of the oxide layer. Each cavity defines a window substantially transparent to infrared light and surrounded by a mesa having closed marginal side walls bonded to the wafer by the layer of oxide. Adjacent rows and columns of the array are separated from each other by dicing lanes. A detector (e.g., bolometer) wafer is also provided. The detector wafer has an upper surface with an array of infrared detector arrays corresponding in size and location to the array of cavities in the window wafer and a corresponding array of readout integrated circuits respectively interconnected with associated ones of the infrared detector arrays disposed thereon. Adjacent rows and columns of the infrared detector array are separated from each other by dicing lanes. The window wafer is aligned over the bolometer wafer such that the cavities of the window wafer are respectively disposed over corresponding ones of the infrared detector arrays. Lower surfaces of the side walls of the mesa are bonded with the upper surface of the detector wafer such that each of the cavities is sealed and a plurality of infrared detectors is defined between the two wafers.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the figures of the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figures 1A, 1B, 1C:
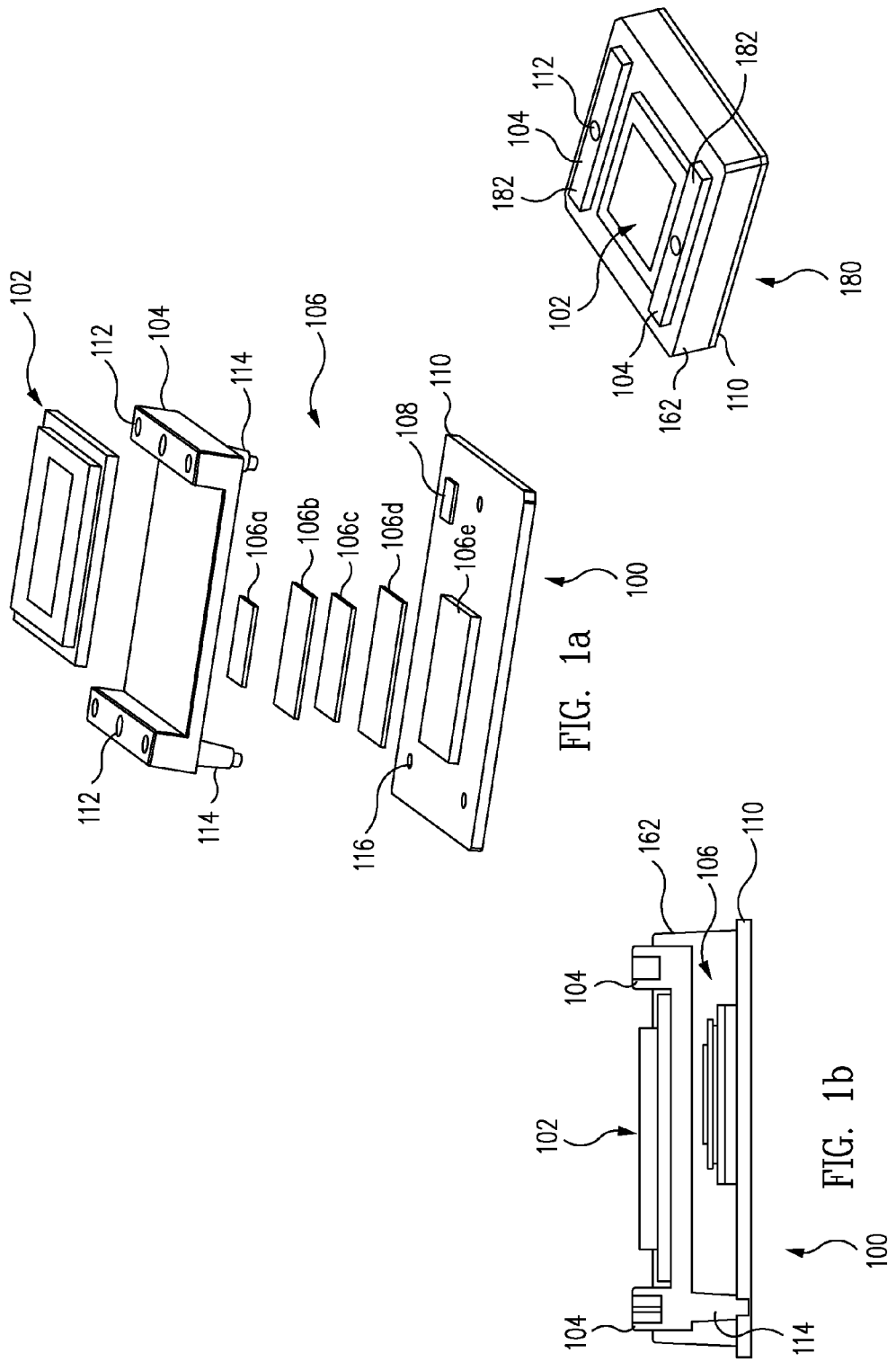
FIGS. 1a-1c show diagrams illustrating infrared camera architectures in accordance with one or more embodiments of the invention.

FIGS. 1a-1c illustrate infrared camera architectures 100, 160, and 180, respectively, in accordance with one or more embodiments of the invention. Infrared (IR) camera architecture 100, shown in an exploded view in FIG. 1a, includes an IR detector 102, a pedestal 104, a die stack 106, and a substrate 110. IR camera architecture 100 may represent, for example in accordance with one or more embodiments, an IR camera or an IR camera core that may be incorporated into an IR camera (e.g., an IR camera system).

IR detector 102, for example, represents any type of IR detector or IR detector package (e.g., a focal plane array (FPA) or vacuum package assembly (VPA), such as a wafer level package (WLP) VPA type of IR camera). IR detector 102 may be wire bonded (e.g., reverse wire bonding, wedge bonding, or forward wire bonding) or otherwise electrically connected, for example, to die stack 106 and/or substrate 110. As a specific example, IR detector 102 may be reverse wire bonded between pads of IR detector 102 and substrate pads of substrate 110.

IR detector 102 may be secured to pedestal 104, in accordance with an embodiment of the invention, with a low stress adhesive. For example, Zymet TC-601.1 adhesive (made by Zymet, Inc. of East Hanover, N.J.) may be used to adhere IR detector 102 to pedestal 104 and provide a low stress bond that may reduce thermal expansion coefficient (CTE) mismatch issues between IR detector 102 (e.g., silicon) and pedestal 104 (e.g., copper). As a specific example, the adhesive may substantially match the CTE of pedestal 104 and IR detector 102, reduce stress on IR detector 102 (e.g., to IR window solder joints of IR detector 102), and reduce warping of IR detector 102 due to stresses (e.g., which may reduce image anomalies and other artifacts).

Pedestal 104 supports IR detector 102 above substrate 110 by using legs 114 (e.g., any number of legs 114, such as three or four) couplable to substrate 110. For example, legs 114 may be secured using adhesive to corresponding portions 116 (e.g., holes, depressions, or pads) of substrate 110. Pedestal 104, with legs 114, provides adequate space for thermal isolation (e.g., to set apart and/or shield to provide some degree of protection from thermal energy) of IR detector 102 from die stack 106. For example, for one or more embodiments, pedestal 104 may provide thermal isolation of IR detector 102 from die stack 106 (or other thermal energy sources within IR camera architecture 100) by providing sufficient spacing from the undesired thermal energy to provide some degree of shielding or protection for IR detector 102 from the undesired thermal energy.

Pedestal 104 may be made, for example, of copper formed by metal injection molding (MIM) and provided with a black oxide or nickel-coated finish. Alternatively, pedestal 104 may be made of any desired material, such as for example zinc, aluminum, or magnesium, as desired for a given application and may be formed by any desired applicable process, such as for example aluminum casting, MIM, or zinc rapid casting, for the given application.

Die stack 106, for example, represents various die, chip packages, or other forms of electrical circuits coupled to substrate 110. As a specific example, die stack 106 may represent an application specific integrated circuit (ASIC, e.g., a mixed signal ASIC) die 106a, a memory die 106b (e.g., a flash memory, such as a serial flash memory), an optional spacer 106c (e.g., a silicon spacer), a memory die 106d (e.g., a DRAM), and an ASIC 106e (e.g., a logic die).

Die stack 106 may be stacked (e.g., three-dimensional (3D) stack) and secured and electrically coupled to substrate 110, as would be understood by one skilled in the art. Various other electrical components (e.g., passive and/or active components), such as, for example, capacitors, inductors, resistors, and/or dies (e.g., a power management IC 108) also may be secured and/or electrically coupled to substrate 110, as needed for a desired application. As a specific example, power management IC (PMIC) 108 may represent a power die or chip that receives 3.3 volts (e.g., a power supply voltage such as from a battery or other external power source) and provides various voltages required (e.g., 1.2, 1.8, and 2.5 volts) for IR camera architecture 100. Consequently, IR camera architecture 100, in accordance with an embodiment, may receive 3.3 volts from and provide IR thermal image data to an IR camera system incorporating IR camera architecture 100.

Figure 2:
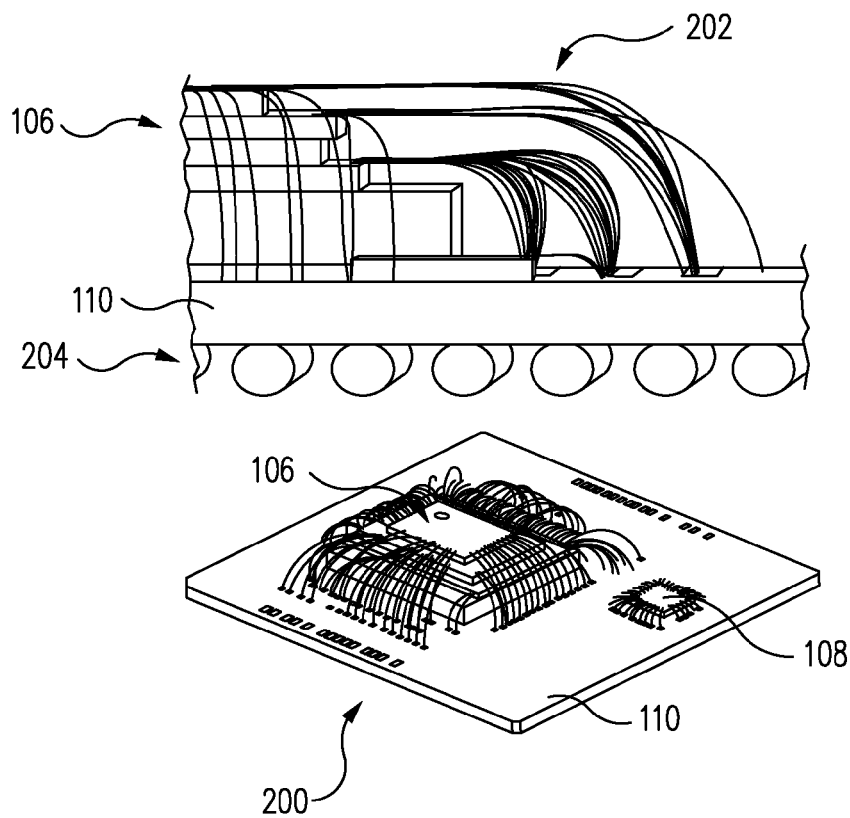
FIG. 2 shows a diagram illustrating an example for bonding various elements within the infrared camera architecture in accordance with an embodiment of the invention.

As a specific example, referring briefly to FIG. 2, die stack 106, in accordance with an embodiment of the invention, may be wire bonded 202 to each other and/or to substrate 110, as shown in the perspective view and magnified side view. PMIC 108 may also be wire bonded or otherwise electrically coupled to substrate 110, as shown in FIG. 2.

ASIC 106e (e.g., a logic die) may be coupled to substrate 110, as an example, using flip chip technology, and substrate 110 may be configured with solder balls 204 using ball grid array (BGA) technology to form electrical connections, as shown in the magnified view of FIG. 2. In general, substrate 110 may represent any type of substrate (e.g., a printed circuit board (PCB), which may be made of, for example, a bismaleimide triazine (BT) substrate, a ceramic, and/or other conventional materials.

FIG. 1b illustrates an IR camera architecture 160, which may represent a cross-sectional, side elevation view of IR camera architecture 100 (FIG. 1a), in accordance with an embodiment of the invention. IR camera architecture 160 shows a portion of IR detector 102, pedestal 104, and die stack 106 encapsulated within a housing 162. For example, after IR camera architecture 100 is completely assembled, a mold may be placed on substrate 110 and liquid epoxy may be injected into the mold, which hardens to form housing 162 (e.g., a hardened, liquid epoxy housing), as would be understood by one skilled in the art. For example for one or more embodiments, the liquid epoxy may cover substrate 110, die stack 106, and/or fill in various recesses of IR camera architecture 160. In a specific implementation example, the liquid epoxy fills in and hardens to cover substrate 110, die stack 106, and various recesses of IR camera architecture 160.

The mold may be designed such that the liquid epoxy does not cover IR detector 102 or otherwise interfere or block IR energy from reaching IR detector 102 (e.g. through an IR window of the VPA). For example, FIG. 1c illustrates an IR camera architecture 180, which may represent a top, perspective view of IR camera architecture 100 (FIG. 1a) or IR camera architecture 160 (FIG. 1b), in accordance with an embodiment of the invention. As shown, a top portion of IR detector 102 is exposed and not covered by housing 162 to allow IR energy to reach IR detector 102. Also, a portion of pedestal 104 (e.g., side rails 182) may also be exposed and not covered by housing 162.

Figure 3:
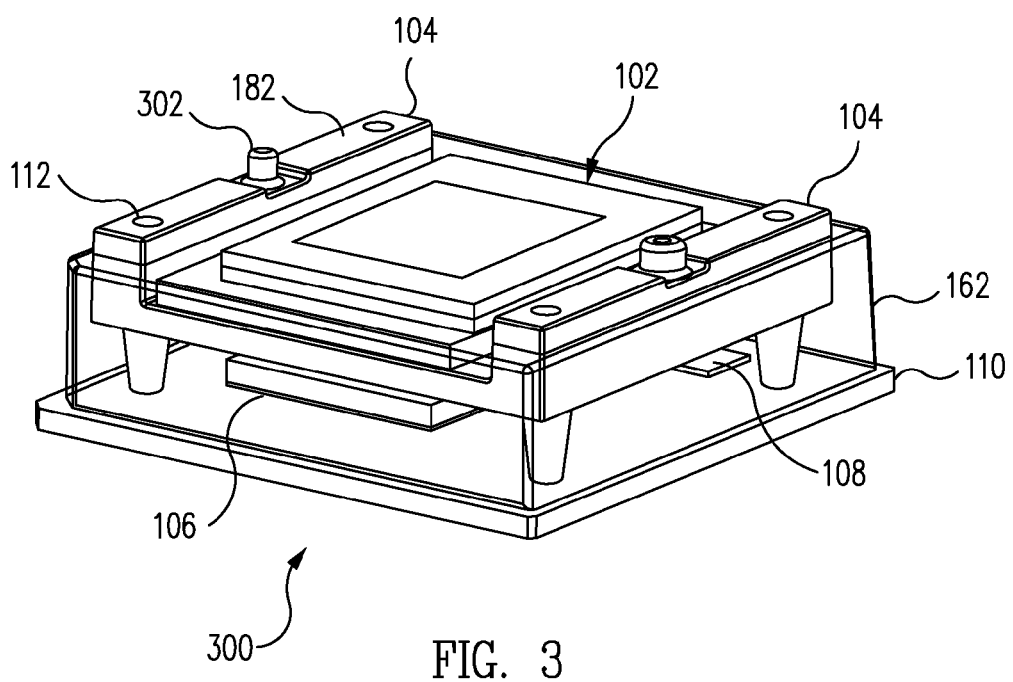
FIG. 3 shows a perspective view diagram illustrating an infrared camera architecture in accordance with an embodiment of the invention.

Pedestal 104 may have one or more alignment indents 112 (e.g., alignment features) in accordance with one or more embodiments of the invention. For example, six alignment indents 112 are shown in pedestal 104 of IR camera architecture 100 (FIG. 1a), while two alignment indents 112 are shown in pedestal 104 of IR camera architecture 180 (FIG. 1c). Pedestal 104 may also have one or more alignment tabs 302 (e.g., alignment protrusions, features, datums, or marks), in accordance with one or more embodiments of the invention, such as illustrated in FIG. 3 for an IR camera architecture 300.

IR camera architecture 300 may represent an alternative embodiment of IR camera architectures 100 (FIG. 1a), 160 (FIG. 1b), or 180 (FIG. 1c). IR camera architecture 300 may include four legs 114, four alignment indents 112, and two alignment tabs 302. Alignment indents 112 and/or alignment tabs 302 may be used to align IR camera architecture 300 and properly position it into an infrared camera system. For example, alignment indents 112 may correspond with alignment tabs on a housing of the infrared camera system and/or alignment tabs 302 may correspond with alignment indents on the housing of the infrared camera system to align IR camera architecture 300 within the housing of the infrared camera system.

In general, pedestal 104 may provide certain advantageous features for the IR camera architecture (e.g., FIG. 1a-3), in accordance with one or more embodiments of the invention. For example for an embodiment, pedestal 104 may provide optical alignment of the IR camera architecture within an infrared camera system, such as with the use of alignment features (e.g., indents 112 and/or alignment tabs 302). As another example for an embodiment, pedestal 104 may provide heat dissipation and heat spreading in a beneficial fashion, such as for IR detector 102. As another example for an embodiment, pedestal 104 may provide space for heat isolation, such as for example to isolate IR detector 102 from unwanted heat from die stack 106 (e.g., to provide some degree of thermal protection for IR detector 102 from die stack 106).

Figure 4:
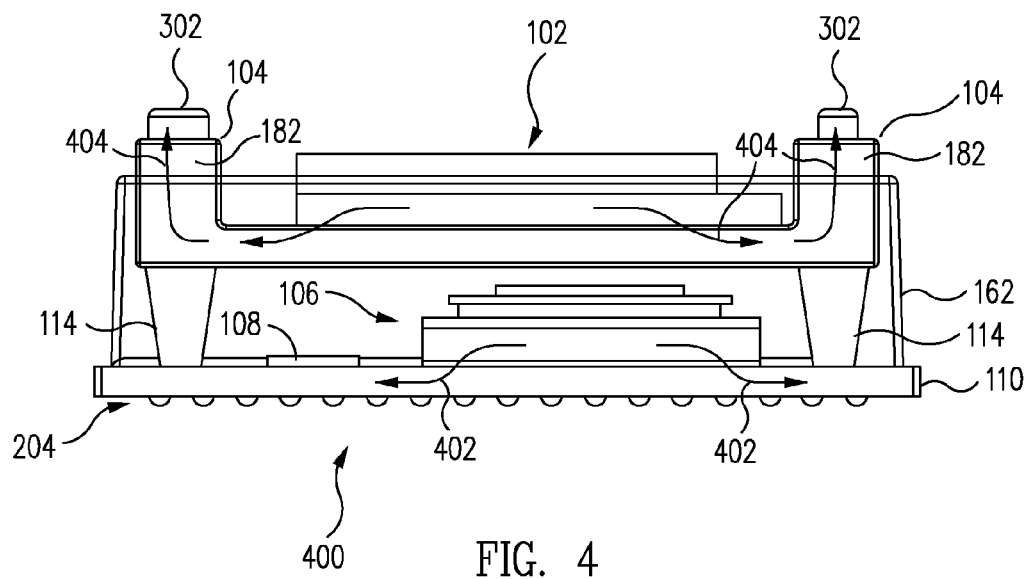
FIG. 4 shows a side view diagram illustrating an example of thermal paths for an infrared camera architecture in accordance with an embodiment of the invention.

As a specific example, FIG. 4 shows a side view diagram illustrating an example of thermal paths for an IR camera architecture 400 in accordance with an embodiment of the invention. IR camera architecture 400 may represent an example embodiment of an IR camera architecture (e.g., such as described in reference to FIG. 1a-3). As shown, thermal paths 402 illustrate the thermal connection between die stack 106 and substrate 110, allowing the dissipation of heat, such as through substrate 110 and through solder balls 204 (e.g., BGA balls or other types of electrical connections).

Similarly, thermal paths 404 illustrate the thermal connection between IR detector 102 and pedestal 104, allowing the spreading and dissipation of heat, such as through pedestal 104 and via the top portion of pedestal 104 (e.g., side rails 182 having alignment tabs 302) and possibly to other portions (e.g., optics) of an infrared camera system incorporating IR camera architecture 400. Pedestal 104 may provide a high thermally conductive structure to maintain good thermal contact with IR detector 102 (e.g., and also to a housing and associated optics), dissipate localized heat rapidly under IR detector 102, and improve thermal uniformity under IR detector 102. As noted, pedestal 104 also provides a spacing above die stack 106 and other electrical components (e.g., PMIC 108) on substrate 110 to provide thermal isolation for IR detector 102.

Figure 5:
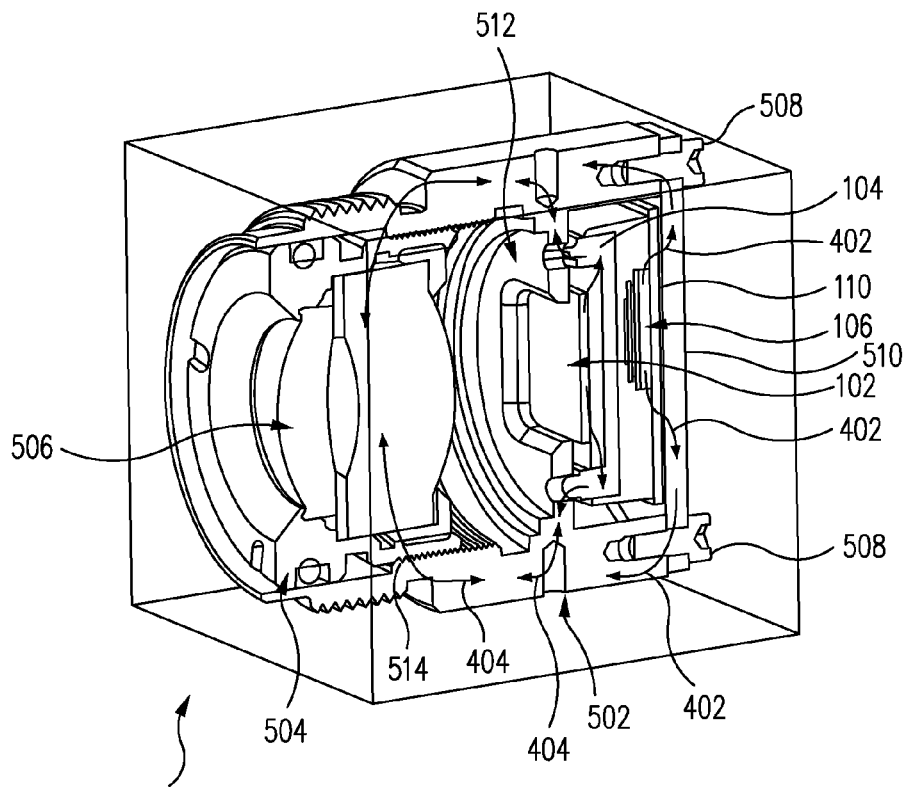
FIG. 5 shows a perspective, cross-sectional view diagram illustrating an infrared camera architecture in accordance with an embodiment of the invention.

FIG. 5 provides a perspective, cross-sectional view illustrating an IR camera architecture 500 in accordance with an embodiment of the invention. IR camera architecture 500 (e.g., an IR camera or IR camera system) includes a housing 502 (e.g., an enclosure), an optics housing 504 that contains one or more lenses 506, and a rear cover 510. As shown, optics housing 504 may engage threads 514 or be secured within housing 502 by other conventional techniques to be properly positioned relative to IR detector 102, in accordance with one or more embodiments.

Rear cover 510 is secured to housing 502 via fasteners 508 (e.g., screws, bolts, or other types of fasteners) and encloses an IR camera architecture (e.g., IR camera architecture 300) within housing 502. In accordance with one or more embodiments, rear cover 510 may be a camera board (e.g., a PCB) with associated electrical components to support and interface with substrate 110. For example, rear cover 510 may include electrical connections to couple with electrical connections of substrate 110 (e.g., solder bumps to couple with solder balls 204 (FIG. 2)) and may include electrical components (e.g., passive and/or active components), such as for example capacitors, inductors, resistors, and/or dies, as needed for a desired application as would be understood by one skilled in the art.

Thermal paths 402 and 404 are shown and illustrate the thermal routes within IR camera architecture 500. For example, thermal paths 402 are shown from die stack 106, through substrate 110, rear cover 510, and fasteners 508, to housing 502. Furthermore, thermal paths 404 are shown from IR detector 102, through pedestal 104 and a partial divider 512, to housing 502 and on through lens 506. Therefore, pedestal 104 provides for temperature coupling of the IR detector 102 with the optics (e.g., lens 506) via pedestal 104 and further provides for temperature uniformity under IR detector 102 (e.g., along readout circuitry of IR detector 102 due to pedestal 104 made of a high thermally conductive material), in accordance with one or more embodiments.

Figure 6A:
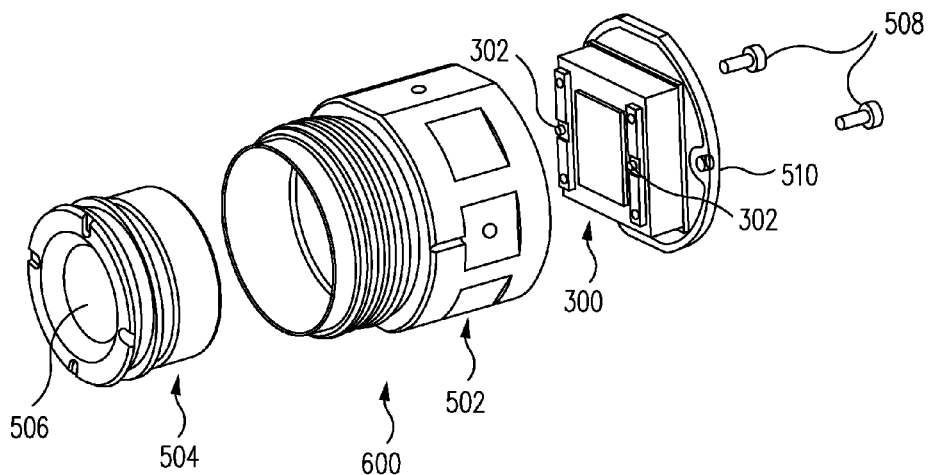
FIGS. 6a and 6b show exploded, perspective view diagrams illustrating an infrared camera architecture in accordance with an embodiment of the invention.
Figure 6B:
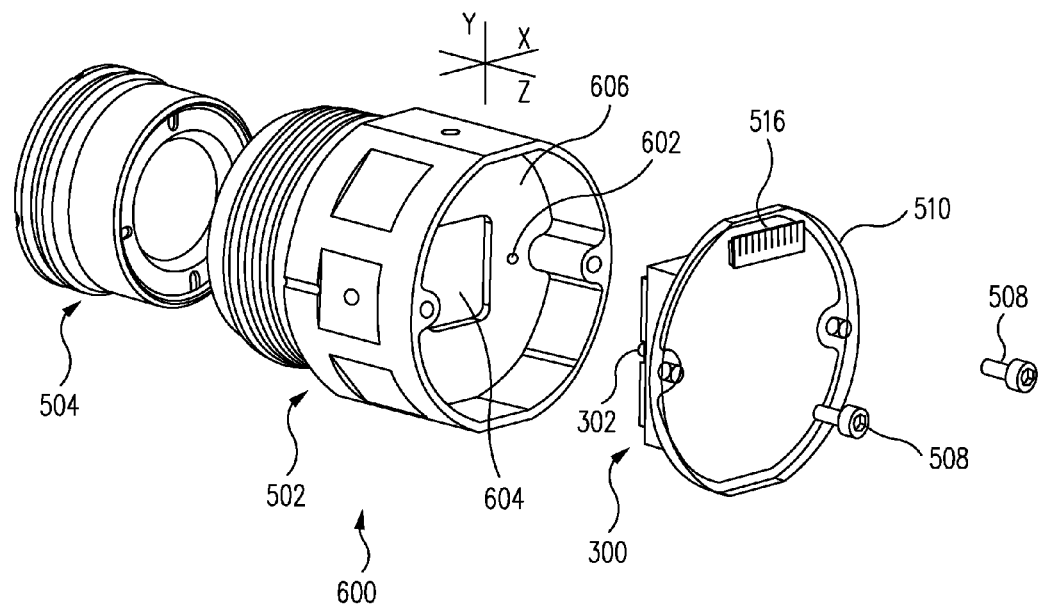

FIGS. 6a and 6b provide exploded, perspective views illustrating an IR camera architecture 600 in accordance with an embodiment of the invention. IR camera architecture 600 (e.g., an IR camera system) is similar to IR camera architecture 500 (FIG. 5), but further illustrates the use of optical X, Y, and/or Z datums (i.e., alignment features) to align and properly position an IR camera architecture, such as IR camera architecture 300, within housing 502 and relative to lens 506 within optics housing 504.

Specifically, in accordance with an embodiment, housing 502 includes alignment indents 602 that correspond with alignment tabs 302 on pedestal 104 (i.e., corresponding alignment datums). Consequently, when alignment tabs 302 are inserted into alignment indents 602, IR detector 102 of IR camera architecture 300 will be properly positioned within housing 502 to receive IR energy through lens 506 via an opening 604 within housing 502 when optics housing 504 is properly positioned within housing 502. As a specific example for an embodiment, alignment tabs 302 couple with alignment indents 602 (e.g., to at least provide proper X and Y positioning and possibly Z positioning), and side rails 182 couple with (e.g., abut) an inner surface 606 of IR camera architecture 600 (e.g., to provide proper Z positioning relative to the example XYZ coordinate system shown), such that IR camera architecture 300 is properly positioned within housing 502.

As shown in FIG. 6b, rear cover 510 (e.g., a PCB electrically coupled to substrate 110) may include an interface connector 516 to provide an interface through which power, command and control, and/or other electrical signals may be provided to IR camera architecture 600 and through which IR thermal image data and/or other electrical signals may be received from IR camera architecture 600. Consequently, IR camera architecture 600 may be easily incorporated into an IR camera system.

Figure 7A:
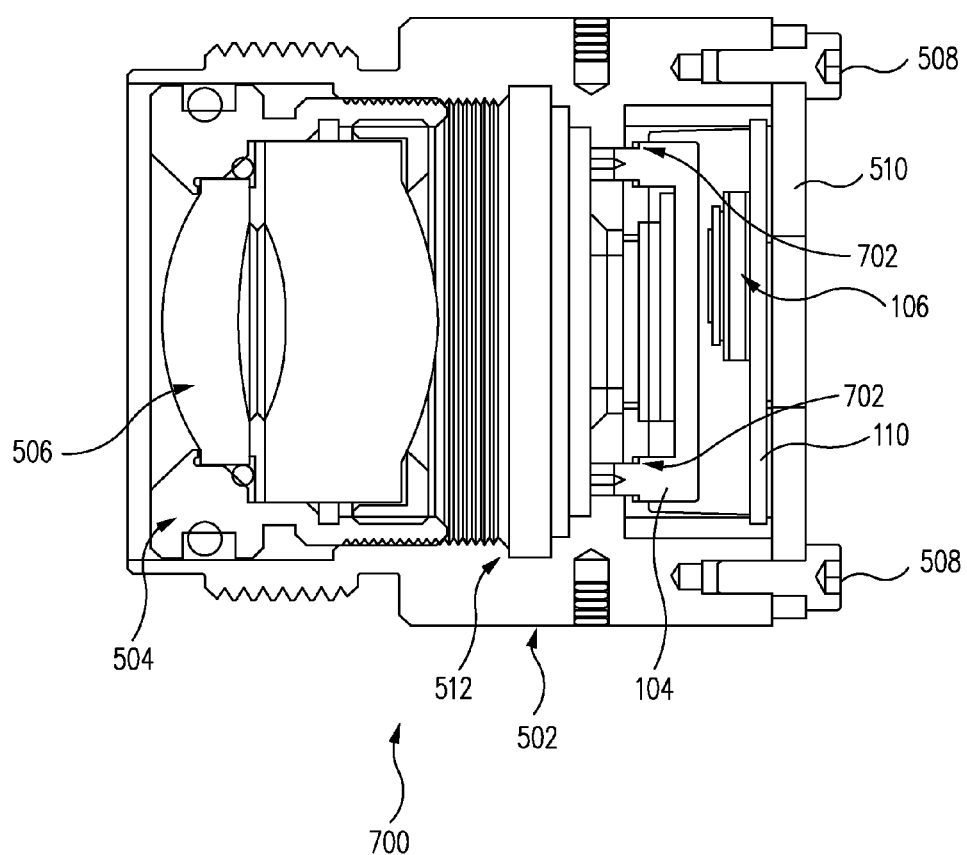
FIGS. 7a and 7b show cross-sectional, side view diagrams illustrating infrared camera architectures in accordance with one or more embodiments of the invention.
Figure 7B:
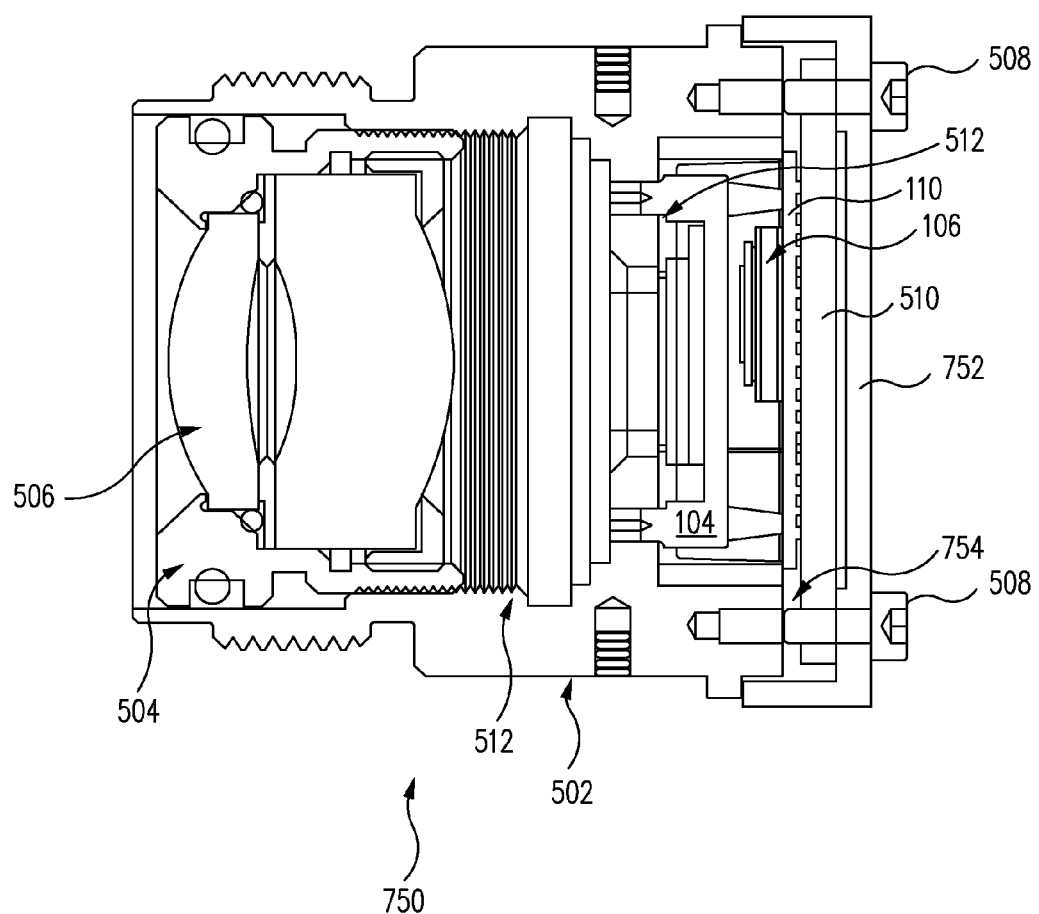

FIGS. 7a and 7b provide cross-sectional, side views illustrating IR camera architectures 700 and 750, respectively, in accordance with one or more embodiments of the invention. IR camera architectures 700 and 750 are similar to IR camera architectures 500 (FIG. 5) and 600 (FIG. 6), but illustrate certain alternative or additional features in accordance with one or more embodiments.

IR camera architecture 700 illustrates rear cover 510 coupled to substrate 110 of the IR camera architecture (e.g., IR camera architecture 300) and secured to housing 502 by fasteners 508. A thermal pad 702 may be disposed between pedestal 104 and partial divider 512 (e.g., a portion of the optics barrel), as shown in FIG. 7a.

IR camera architecture 750 illustrates a thermal pad 754 disposed between substrate 110 and rear cover 510. A housing cover 752 and fasteners 508 enclose the IR camera architecture (e.g., IR camera architecture 300) within housing 502, while pedestal 104 directly contacts partial divider 512 (e.g., a portion of the optics barrel), as shown in FIG. 7b.

In accordance with one or more embodiments, infrared camera architectures (e.g., as discussed in reference to FIG. 1a-4) are disclosed, which may provide certain advantages over conventional infrared camera architectures. For example, the infrared camera architecture may be viewed as and represent a single IR camera package (e.g., a one chip IR camera core architecture or a single IR camera core) that may operate as an uncooled IR camera core that requires minimal external support circuitry (e.g., 3.3 volts in, IR image data out).

The IR camera architecture, for example, may include a pedestal that supports an IR detector and provides adequate space for thermal isolation between the IR detector and the associated electronics below the pedestal. The associated electronics may include a die stack (e.g., chip stack or heat sink chip/die stack) and possibly other electrical components (e.g., discrete capacitors, inductors, resistors, and/or chips, such as a power management chip) such that the IR detector and the associated electronics are merged within a single core package (e.g., encapsulated within a plastic overmold with optical alignment tabs/indents on the pedestal and an unobstructed IR detector window).

The pedestal, for one or more embodiments, may provide optical alignment, heat dissipation, and heat spreading to aid the IR detector's functionality. The pedestal may also provide sufficient space to thermally isolate the IR detector from the associated electronics on the substrate below the pedestal.

Furthermore, the pedestal may thermally link the IR detector with associated optics, in accordance with one or more embodiments. For example, as discussed in reference to FIGS. 4-7b, the IR camera architecture may be thermally coupled within an IR camera (e.g., IR camera architectures 500, 600, 700, or 750) to thermally link the IR detector to the IR camera's optics and housing and further thermally link and dissipate and spread heat from the associated electronics (e.g., via the substrate and/or BGA) to the IR camera housing and optics, which may provide a thermally uniform and stable architecture.

Figure 8:
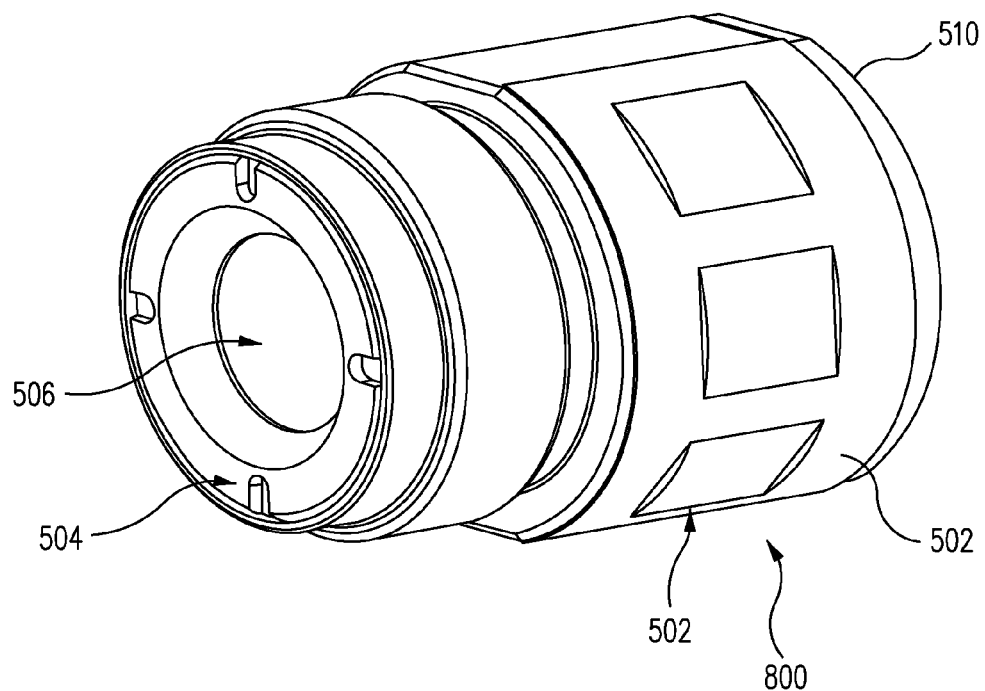
FIG. 8 shows a perspective view diagram illustrating an infrared camera architecture in accordance with an embodiment of the invention.

FIG. 8 provides a perspective view illustrating an assembled IR camera 800 in accordance with an embodiment of the invention. IR camera 800 may include an IR camera architecture, such as IR camera architecture 100, 160, 180, 300, or 400 (e.g., as discussed in reference to FIGS. 1-4) and may further represent an IR camera architecture similar to IR camera architectures 500, 600, 700, and 750 (e.g., as discussed in reference to FIGS. 5-7b). In general, IR camera 800 may be self contained and easily implemented within a system requiring IR imaging capability.

Figure 9:
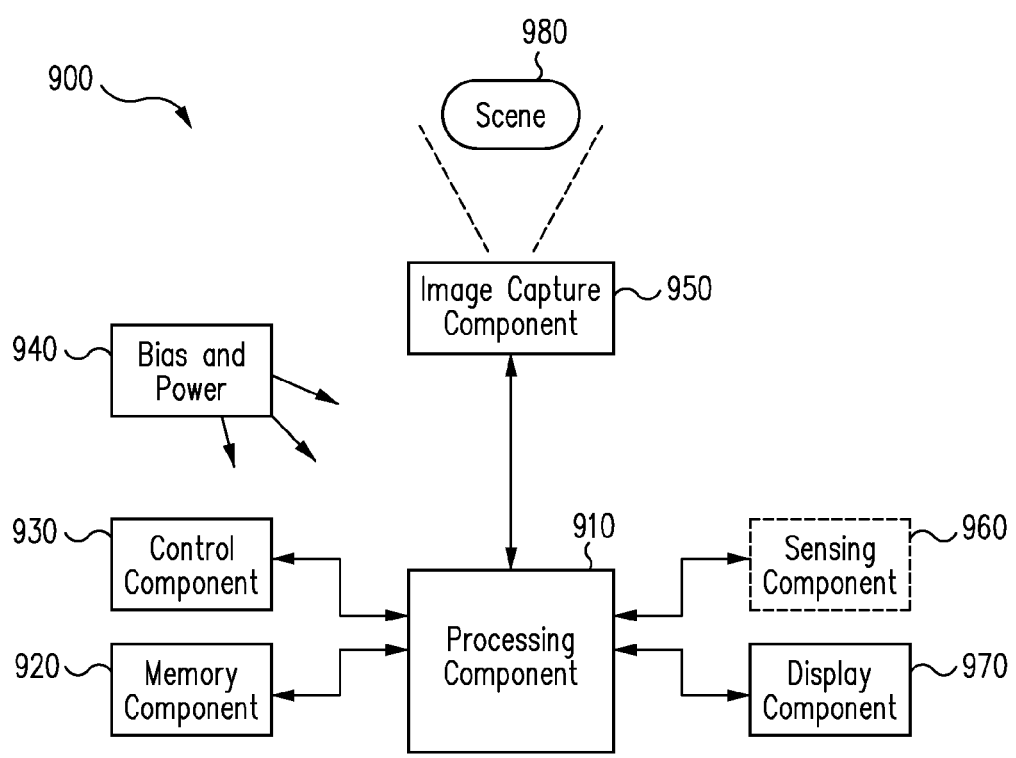
FIG. 9 shows a block diagram illustrating an infrared camera system in accordance with one or more embodiments of the invention.

FIG. 9 provides a block diagram illustrating a system 900 (e.g., an IR camera or IR camera system), which is configured to capture and process IR images, in accordance with one or more embodiments of the invention. System 900 may represent an IR camera system, which includes one of the IR camera architectures disclosed herein.

System 900 comprises, in one implementation, a processing component 910, a memory component 920, a control component 930, a power component 940, an image capture component 950, and a display component 970. Optionally, system 900 may include a sensing component 960.

System 900 may represent, for example, an infrared imaging device, such as an infrared camera (e.g., an infrared camera system), to capture and process images, such as still or video IR images of a scene 980. System 900 includes at least one of the IR camera architectures disclosed herein (e.g., IR camera architecture 100 or IR camera architecture 500), with the IR camera architecture represented by various portions of system 900.

For example, the IR camera architecture may be represented by image capture component 950 (e.g., IR detector 102), power component 940 (e.g., ASIC 106a and/or PMIC 108), memory component 920 (e.g., within die stack 106, such as memory die 106b and 106d), and processing component 910 (e.g., within die stack 106, such as ASIC 106a and/or 106e of FIG. 1a). System 900 may, for example, include further functionality in addition to what is represented by IR camera architecture, for the above example. For example, there may be additional memory and processing functionality (e.g., additional portions of memory component 920, power component 940, and processing component 910) within system 900 that is not included within the IR camera architecture.

As a specific example, system 900 may represent a distributed network system with one or more IR camera architectures that are networked to a computer (e.g., a server) to receive the IR image data and store, display, and/or further process the IR image data. System 900 may also comprise, for example, a portable device and may be incorporated, e.g., into a vehicle (e.g., an automobile or other type of land-based vehicle, an aircraft, a marine craft, or a spacecraft) or a non-mobile installation requiring infrared images (e.g., IR image data) to be stored and/or displayed.

In accordance with one or more embodiments, processing component 910 may comprise any type of a processor or a logic device (e.g., a programmable logic device (PLD) or ASIC configured to perform processing functions). Processing component 910 may be adapted to interface and communicate with components 920, 930, 940, 950, and 970 to perform method and processing steps and/or operations, as would be understood by one skilled in the art.

Memory component 920 comprises, in accordance with an embodiment, one or more memory devices adapted to store data and information, including for example infrared data and information. Memory device 920 may comprise one or more various types of memory devices, including volatile and non-volatile memory devices. Processing component 910 may be adapted to execute software or be configured by a bit stream stored in memory component 920 so as to perform method and process steps and/or operations described herein.

Image capture component 950 comprises, in accordance with an embodiment, any type of infrared image sensor, such as for example one or more infrared sensors (e.g., any type of multi-pixel infrared detector, such as a focal plane array) for capturing infrared image data (e.g., still image data and/or video data) representative of an image, such as scene 980. In one example implementation, the infrared sensors of image capture component 950 provide for representing (e.g., converting) the captured image data as digital data (e.g., via an analog-to-digital converter included as part of the infrared sensor or separate from the infrared sensor as part of system 900).

In accordance with an embodiment, the infrared image data (e.g., infrared video data) may comprise non-uniform data (e.g., real image data) of an image, such as scene 980. Processing component 910 may be adapted to process the infrared image data (e.g., to provide processed image data), store the infrared image data in memory component 920, and/or retrieve stored infrared image data from memory component 920. For example, processing component 910 may be adapted to process infrared image data stored in memory component 920 to provide processed image data and information (e.g., captured and/or processed infrared image data).

Control component 930 comprises, in accordance with an embodiment, a user input and/or interface device that is adapted to generate a user input control signal. For example, the user input and/or interface device may include a rotatable knob (e.g., a potentiometer), push buttons, a slide bar, a keyboard, and the like. Processing component 910 may be adapted to sense control input signals from a user via control component 930 and respond to any sensed control input signals received therefrom. Processing component 910 may be adapted to interpret such a control input signal as a parameter value, as generally understood by one skilled in the art.

In accordance with an embodiment, control component 930 may comprise a control unit (e.g., a wired or wireless handheld control unit) having push buttons adapted to interface with a user and receive user input control values. In one implementation, the push buttons of the control unit may be used to control various functions of the system 900, such as autofocus, menu enable and selection, field of view, brightness, contrast, noise filtering, high pass filtering, low pass filtering, and/or various other features as understood by one skilled in the art.

Power component 940, in accordance with an embodiment, provides various power supply voltages (e.g., reference voltages, bias voltages, reference currents, or other desired bias and power signals) required by the IR camera architecture and optionally for the entire system 900, depending upon the specific application and requirements. As a specific example, power component 940 may represent PMIC 108 of FIG. 1a, in accordance with an embodiment, and system 900 may further include additional power supply sources.

Display component 970 comprises, in accordance with an embodiment, an image display device (e.g., a liquid crystal display (LCD) or various other types of generally known video displays or monitors). Processing component 910 may be adapted to display image data and information on display component 970. Processing component 910 may be adapted to retrieve image data and information from memory component 920 and display any retrieved image data and information on display component 970. Display component 970 may comprise display electronics, which may be utilized by processing component 910 to display image data and information (e.g., infrared images). Display component 970 may be adapted to receive image data and information directly from image capture component 950 via the processing component 910, or the image data and information may be transferred from memory component 920 (e.g., via processing component 910).

Optional sensing component 960 comprises, in accordance with an embodiment, one or more sensors of various types, depending on the application or implementation requirements, as would be understood by one skilled in the art. The sensors of optional sensing component 960 provide data and/or information to at least processing component 910. In one aspect, processing component 910 may be adapted to communicate with sensing component 960 (e.g., by receiving sensor information from sensing component 960) and with image capture component 950 (e.g., by receiving data and information from image capture component 950 and providing and/or receiving command, control, and/or other information to and/or from one or more other components of system 900).

In various implementations, sensing component 960 may provide information regarding environmental conditions, such as outside temperature, lighting conditions (e.g., day, night, dusk, and/or dawn), humidity level, specific weather conditions (e.g., sun, rain, and/or snow), distance (e.g., via a laser rangefinder), and/or whether a tunnel or other type of enclosure has been entered or exited. Sensing component 960 may represent conventional sensors as generally known by one skilled in the art for monitoring various conditions (e.g., environmental conditions) that may have an effect (e.g., on the image appearance) on the data provided by image capture component 950.

In some implementations, optional sensing component 960 (e.g., one or more of sensors) may comprise devices that relay information to processing component 910 via wired and/or wireless communication. For example, optional sensing component 960 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In accordance with one or more embodiments, components of system 900 may be combined and/or implemented or not, as desired or depending on the application or requirements, with system 900 representing various functional blocks of a related system. In one example, processing component 910 may be combined with memory component 920, image capture component 950, display component 970, and/or optional sensing component 960. In another example, processing component 910 may be combined with image capture component 950 with only certain functions of processing component 910 performed by circuitry (e.g., a processor, a microprocessor, a logic device, a microcontroller, etc.) within image capture component 950. Furthermore, various components of system 900 may be remote from each other (e.g., image capture component 950 may comprise a remote sensor with processing component 910, etc., representing a computer that may or may not be in communication with image capture component 950).

Figure 10:
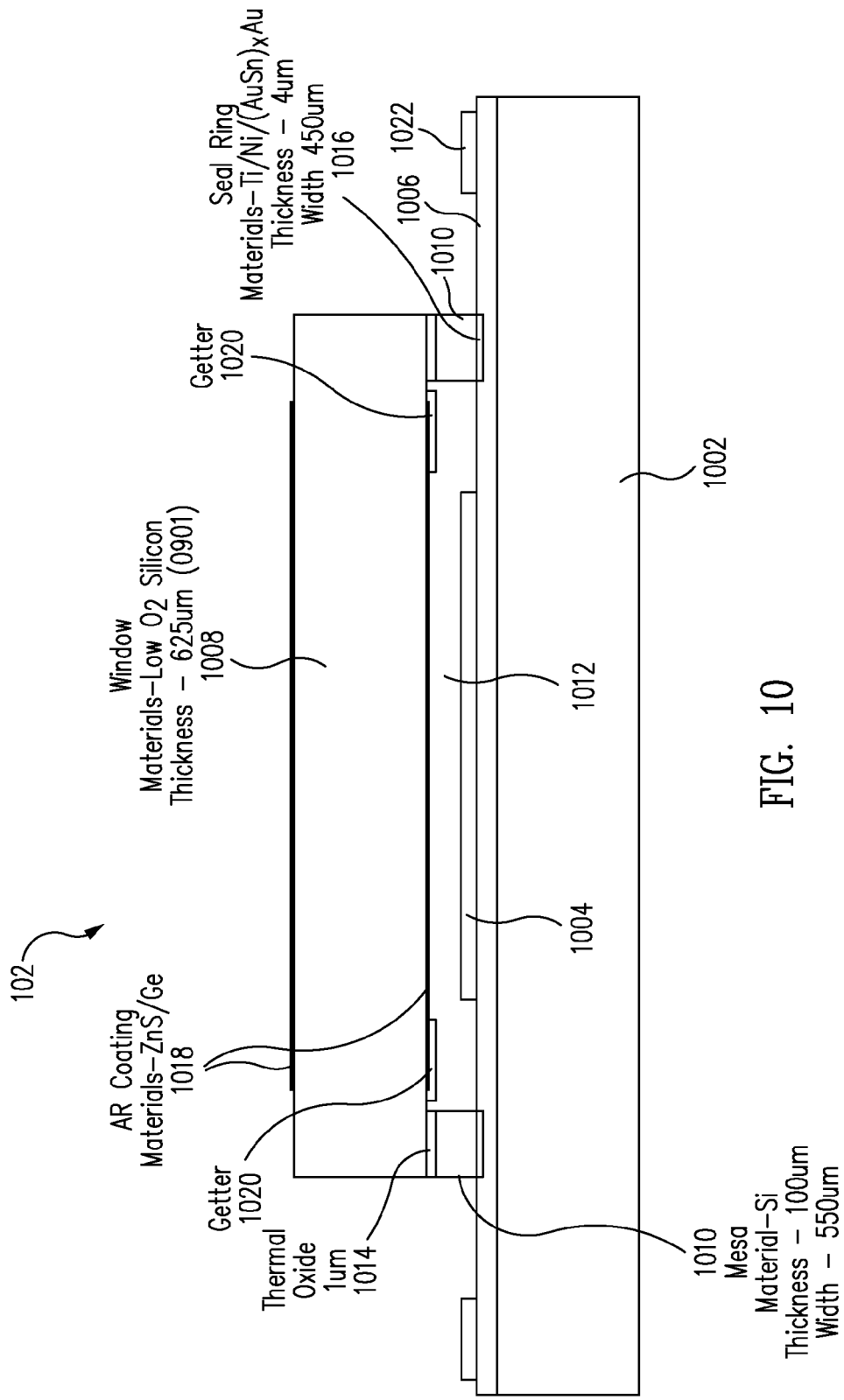
FIG. 10 is a cross-sectional side elevation view of an example embodiment of an infrared detector in accordance with an embodiment of the invention.

As discussed above, for example in connection with FIGS. 1a-1c, in some embodiments, the infrared detector 102 may comprise a vacuum package assembly (VPA), such as a wafer level package (WLP) VPA. FIG. 10 is a cross-sectional side elevation view of an example embodiment of such an infrared detector 102 produced in accordance with one or more embodiments of wafer level packaging (WLP) methods, and FIG. 12 is a top plan view thereof.

Figures 11, 12:
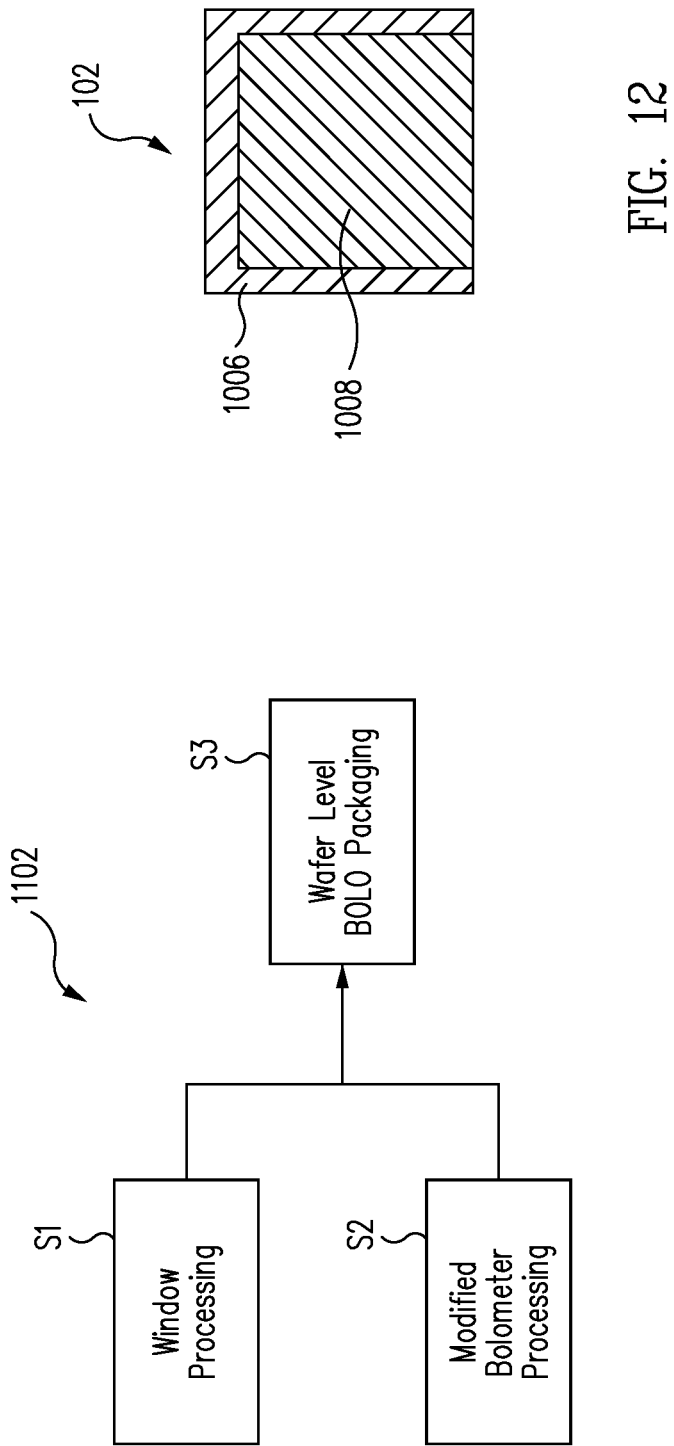
FIG. 11 is process flow diagram of an example embodiment of a wafer level processing (WLP) method for producing an infrared detector in accordance with an embodiment of the invention.
FIG. 12 a top plan view of the example infrared detector of FIG. 10 in accordance with an embodiment of the invention.

As illustrated in FIGS. 10 and 12, the example infrared detector 102 includes a substrate 1002 having an array 1004 of infrared detectors (e.g., microbolometers) and a readout integrated circuit 1006 interconnected with the array 1004 disposed on an upper surface thereof. As an example implementation, the array 1004 may be referred to herein as a microbolometer array for a specific type of infrared detector, but it should be understood that the WLP techniques disclosed herein may be applied more generally to various types of infrared detectors, as would be understood by one skilled in the art.

A generally planar window 1008 is spaced above the array 1004, the window 1008 being substantially transparent to infrared light. A mesa 1010 is coupled (e.g., bonded) to the window 1008, e.g., with a thermal oxide layer 1014 such that the window 1008 and the mesa 1010 may form a bonded silicon on insulator (SOI) wafer pair for one or more embodiments. The mesa 1010 has closed marginal side walls disposed between an outer periphery of a lower surface of the window 1008 and an outer periphery of the upper surface of the substrate 1002 and defines a closed cavity 1012 between the window 1008 and the array 1004 that encloses the infrared detector array 1004. A solder seal ring 1016 is shown bonding the mesa 1010 to the substrate 1002 so as to seal the cavity 1012 (e.g., to provide a hermetic seal for an evacuated WLP VPA).

As illustrated in FIG. 10, in one example embodiment, the window 1008 may comprise low-oxygen ($O_2$) silicon (Si) (or alternatively float zone silicon) having a thickness of about 625 microns ($\mu m$). In another example embodiment, the side walls of the mesa 1010 may comprise Si having a width of about 550 $\mu m$ and a height of about 100 $\mu m$. In another example embodiment, the mesa 1010 and the window 1008 may comprise a semiconductor, e.g., low-$O_2$ Si, and the upper surface of the side walls of the mesa 1010 may be bonded to the lower surface of the window 1008 by a layer of a thermal oxide 1014 of the same semiconductor, e.g., silicon dioxide ($SiO_2$), having a thickness of about 1 $\mu m$. In yet another embodiment, the lower surface of the side walls of the mesa 1010 may be bonded to an upper surface of the substrate 1002 by a joint of fused or layered solder rings 1016 of, e.g., an alloy of titanium (Ti)/nickel (Ni)/gold-tin-gold ($AuSn_xAu$), respectively formed, e.g., using photolithography techniques, on the lower surface of the side walls of the mesa 1010 and the upper surface of the substrate 1002 and having a combined thickness of, e.g., about 4 $\mu m$ and a width of, e.g., about 450 $\mu m$.

In one embodiment, the infrared detector 102 may include at least one antireflective coating 1018, e.g., Zinc Sulfide (ZnS)/Germanium (Ge), formed, e.g., by a physical vapor deposition (PVD) method, on an upper and/or a lower surface of the window 1008 to prevent infrared light incident upon the coated surfaces from being reflected away from the microbolometer array 1004. In another embodiment, a getter 1020, e.g., Zirconium (Zr) alloy, may be formed, e.g., by sputtering, on a lower surface of the window 1008 in the cavity 1012 before, during, and/or after it has been evacuated. The getter material process may be provided, for example, by SAES Getters™ of Colorado Springs, Colo. It should be understood that the materials, dimensions, and processes disclosed herein are examples for one or more embodiments and are not limiting and that other suitable materials and processes, as would be understood by one skilled in the art, may be used in accordance with one or more embodiments.

As illustrated in FIG. 10, in another example embodiment, the infrared detector 102 may include at least one electrical test pad 1022 disposed on the upper surface of the substrate 1002 adjacent to the outer periphery of the window 1008. As discussed in more detail below, the test pad 1022 may be coupled to the readout integrated circuit 1006 and used to test the infrared detector 102 electrically at the wafer level and before it is singulated.

Following is a description of an example embodiment of a method 1102 (FIG. 11) by which the example infrared detector 102 of FIGS. 10 and 12, as well as other infrared detectors, may be manufactured reliably and efficiently in volume quantities using wafer level packaging (WLP) techniques. As illustrated in the top level overview of the method in FIG. 11, in one embodiment, the example method 1102 may begin at stage or step 1 (S1) with the provision of a "window" wafer and at S2 with a "bolometer" wafer as described in more detail below, then proceed at S3 with the WLP processes that combines the two wafers into an assembly and process the assembly that results in a plurality of infrared detectors 102.

Figure 13:
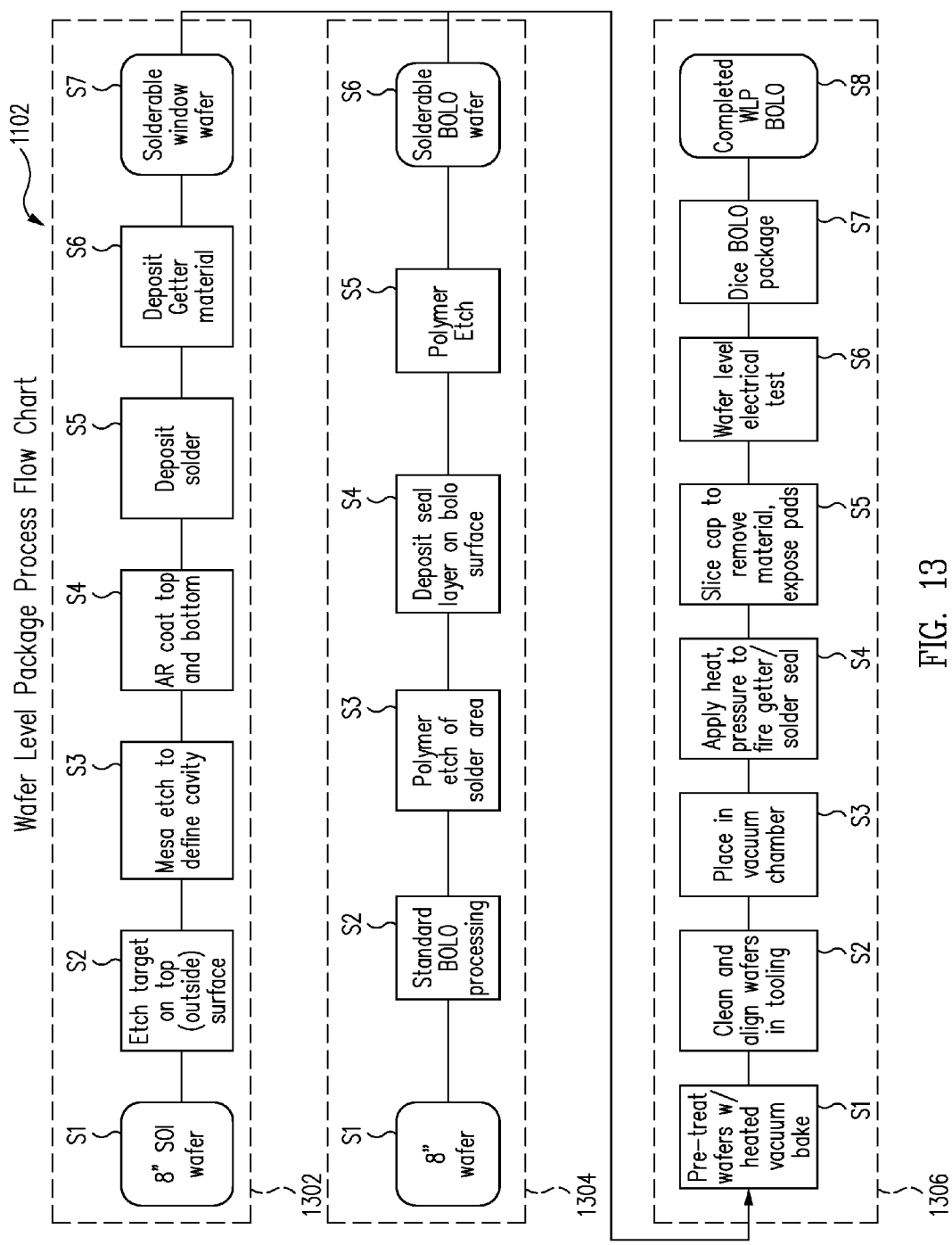
FIG. 13 is a more detailed process flow diagram of the example WLP method of FIG. 11 in accordance with an embodiment of the invention.

As illustrated in detail in FIG. 13, the example WLP method 1102 comprises two methods, viz., a "window wafer" production method 1302 and a "bolometer wafer" production method 1304, that merge into yet a third "wafer assembly and bonding" method 1306. The various stages set forth in FIG. 13 are described in detail as follows for one or more embodiments.

Figure 14:
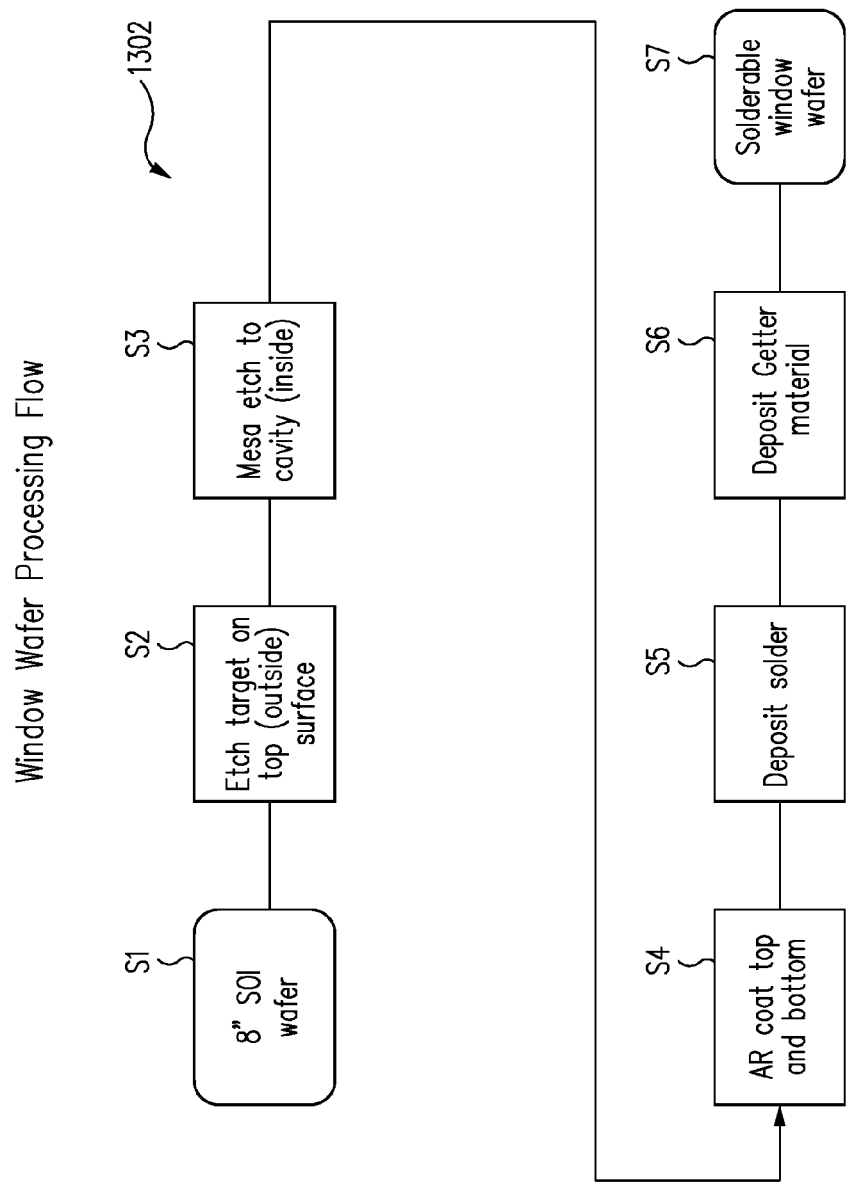
FIG. 14 is a process flow diagram of an example embodiment of a WLP method for producing a window wafer in accordance with an embodiment of the invention.
Figure 15:
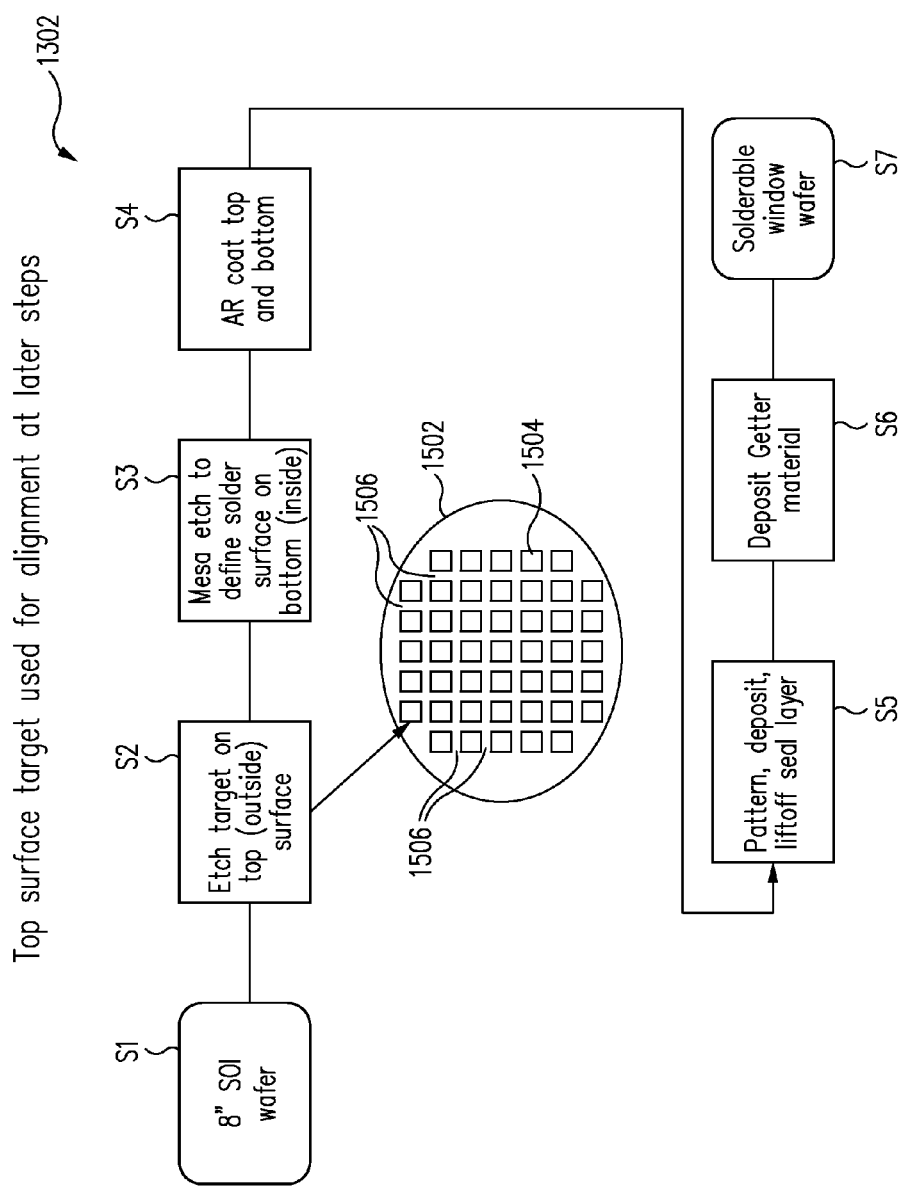
FIG. 15 is a process flow diagram of the example window wafer WLP method of FIG. 14, showing a target etching step of the method applied to the window wafer in accordance with an embodiment of the invention.

As illustrated in FIG. 14, the example window wafer production method 1302 begins at S1 with the provision of a wafer 1502 (see FIG. 15), e.g., a silicon-on-insulator (SOI) wafer, having a layer of oxide 1014, e.g., a thermal oxide layer, sandwiched between two layers, i.e., a "window" layer and a "mesa" layer, each of a semiconductor material, e.g., Si. As illustrated in FIG. 15, at S2, an array of "targets" 1504 (e.g., used to define the resulting windows for resulting infrared detectors 102 and may be useful for the formation of corresponding mesas 1010 and associated cavities 1012) is formed using, e.g., photolithography techniques, on a surface of the window wafer 1502, e.g., on the window layer or the mesa layer of the wafer 1502.

Figure 16:
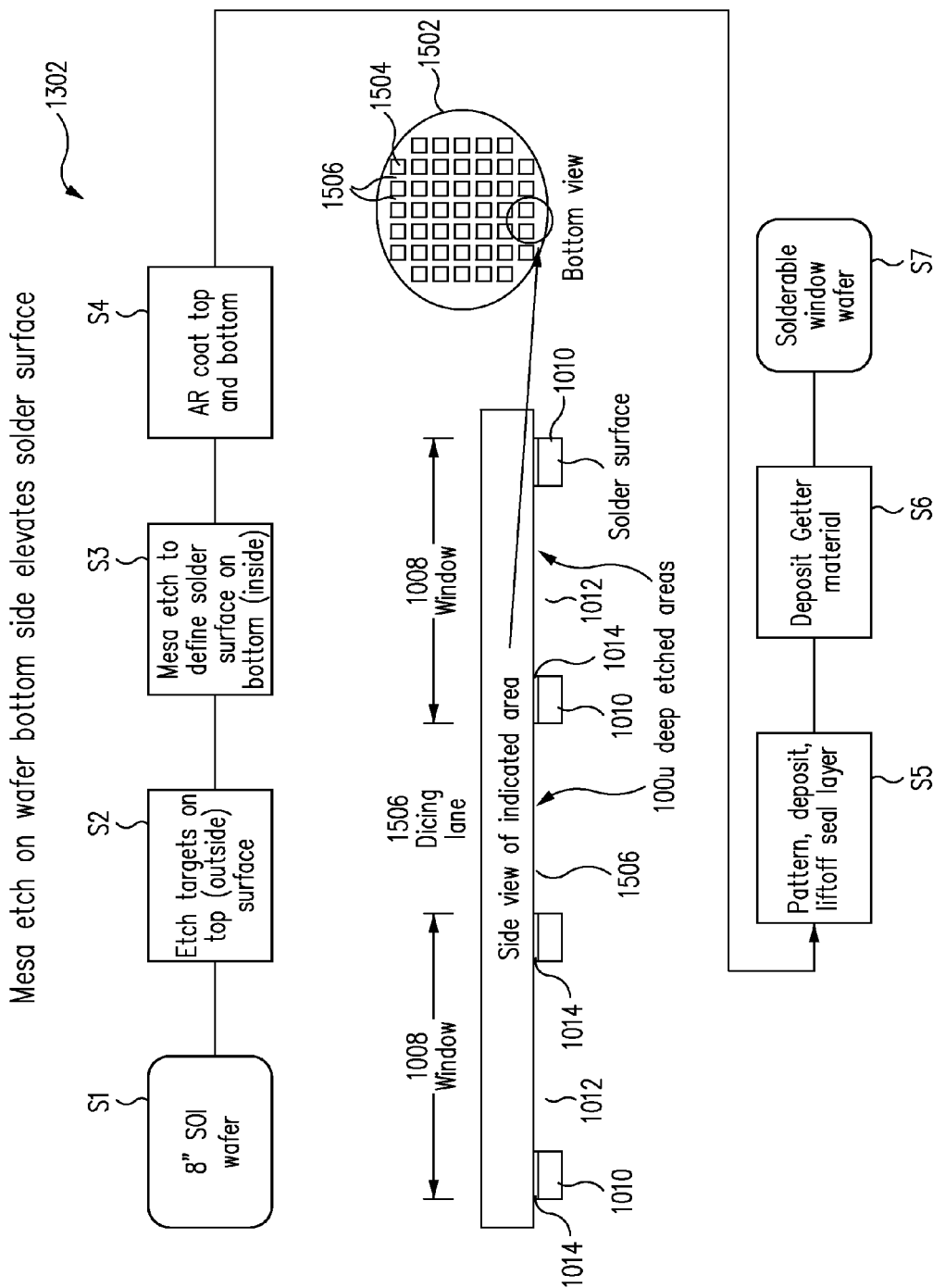
FIG. 16 is a process flow diagram of the example window wafer WLP method of FIG. 14, showing a mesa etching step of the method applied to the window wafer in accordance with an embodiment of the invention.

As illustrated in FIG. 16, at S3 of the example method 1302, the array of mesa 1010 and cavity 1012 targets 1504 on the wafer 1502 are then etched using, e.g., a Deep Reactive Ion Etching (DRIE) process, in the surface of the mesa layer of the window wafer 1502. The etching defines an array of windows 1008 in the window layer of the wafer 1502 that are substantially transparent to infrared light, each of which is surrounded by a mesa 1010 having closed marginal side walls bonded to the window wafer 1502 by the oxide layer 1014. As shown in FIG. 15, adjacent rows and columns of the array are separated from each other by dicing lanes 1506.

While using a single semiconductor and etch process may suffice to form a mesa and windows, in one advantageous embodiment, a two part window wafer may be used which is separated by a separation or bonding layer (e.g. oxide layer). In such an embodiment, the etching process at S3 of the method 1302 may include etching the surface of the window wafer 1502 down to the oxide layer 1014 using, e.g., a DRIE process, so as to form the array of mesas 1010 and associated cavities 1012. The oxide layer 1014, which may act as a etch stop, may be selectively removed from the surface of the window wafer 1502 in such a way that the lower surfaces of the windows 1008, which correspond to lower surface of the window layer of the window wafer 1502, retain their as-formed window-layer smoothness and planarity, while the respective marginal side walls of the mesas 1010 remain firmly bonded to the window wafer 1502 by the remaining oxide layer 1014. This latter removal process may be effected, for example, using a hydrofluoric acid etching technique to remove the oxide layer 1014 in the region of cavities 1012. In various embodiments, the separation layer may be a variety of other boding materials.

Figure 17:
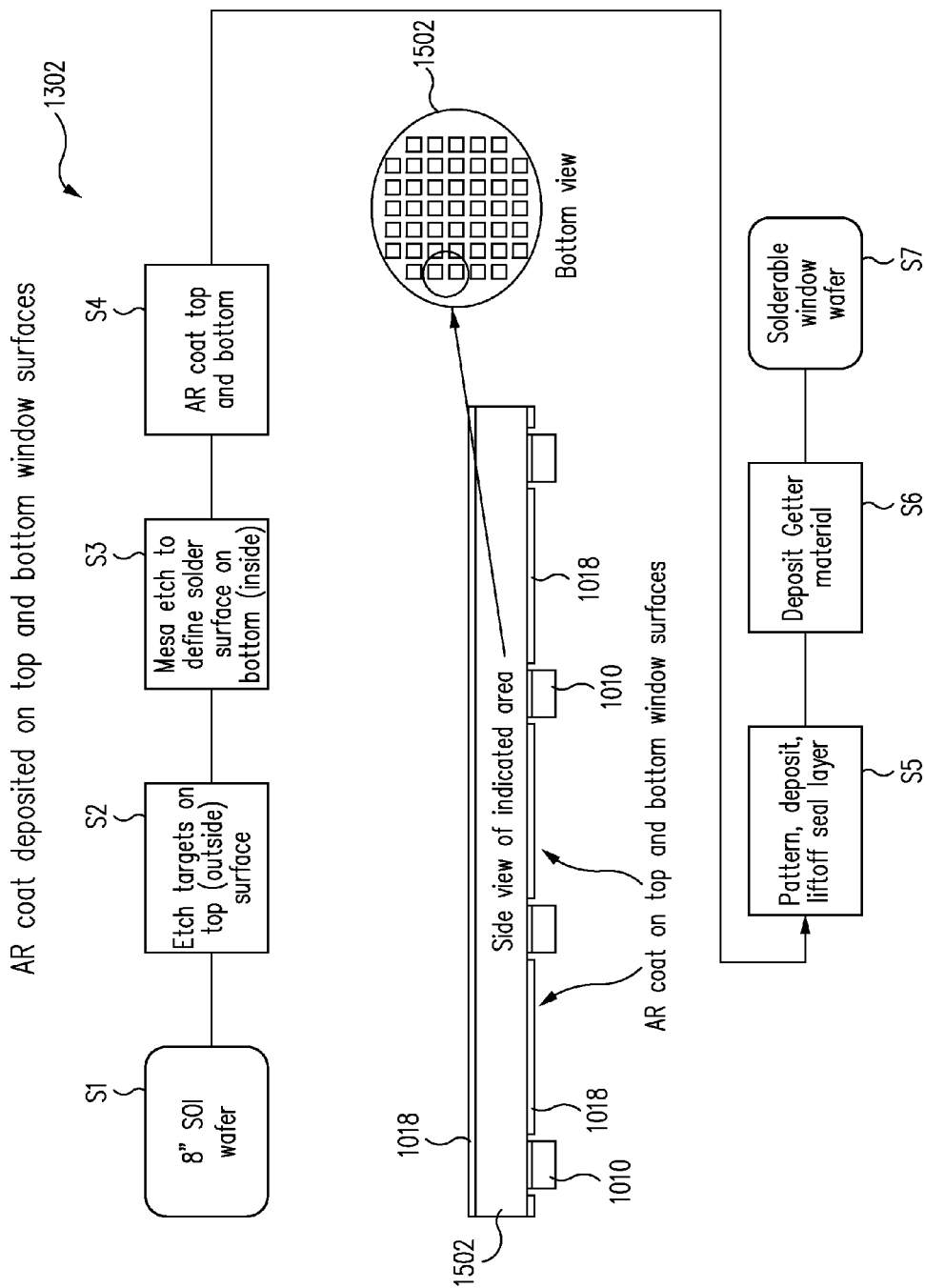
FIG. 17 is a process flow diagram of the example window wafer WLP method of FIG. 14, showing an antireflective (AR) coating step of the method applied to the window wafer in accordance with an embodiment of the invention.
Figure 18:
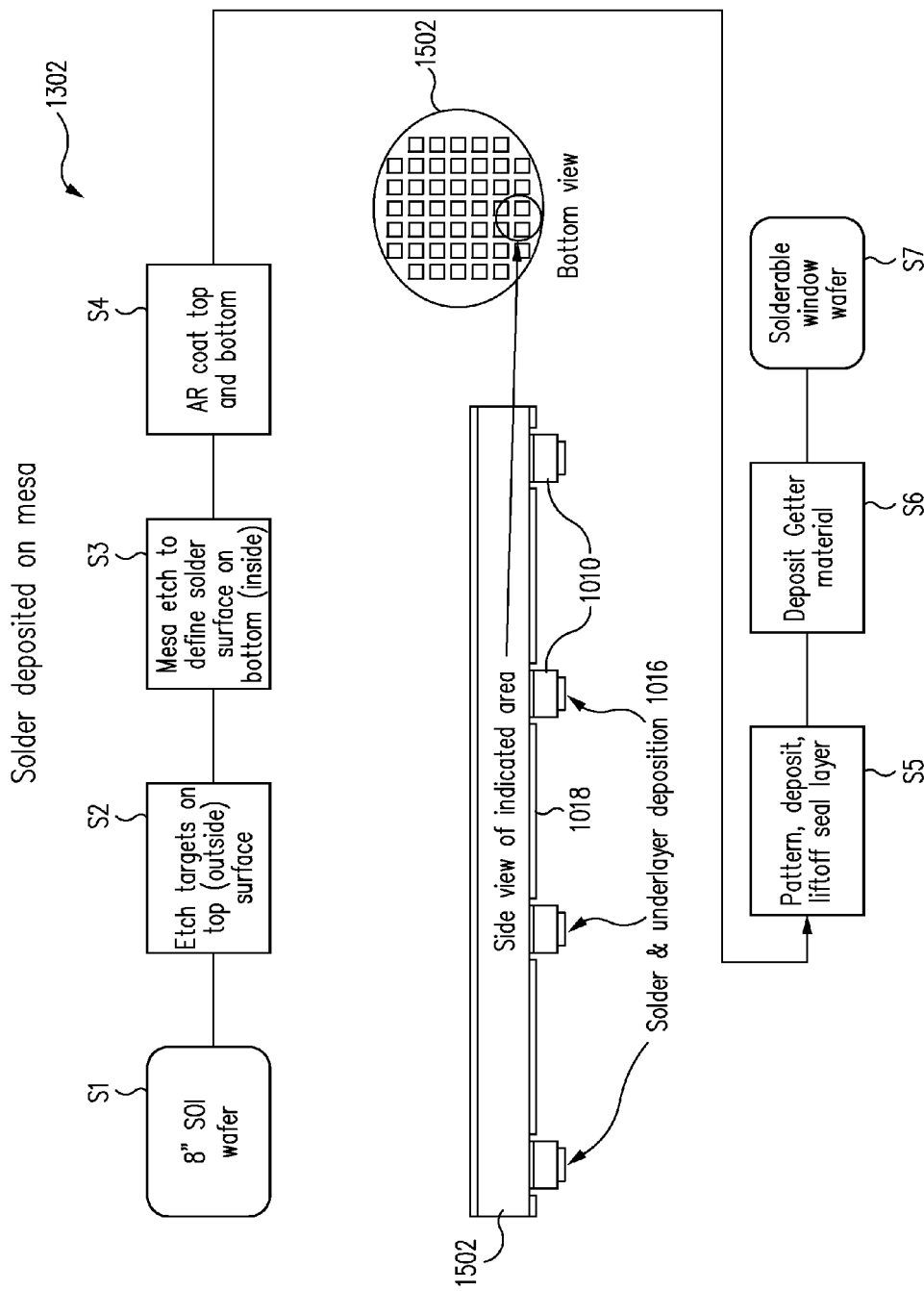
FIG. 18 is a process flow diagram of the example window wafer WLP method of FIG. 14, showing a sealing ring deposition step of the method applied to the window wafer in accordance with an embodiment of the invention.
Figure 19:
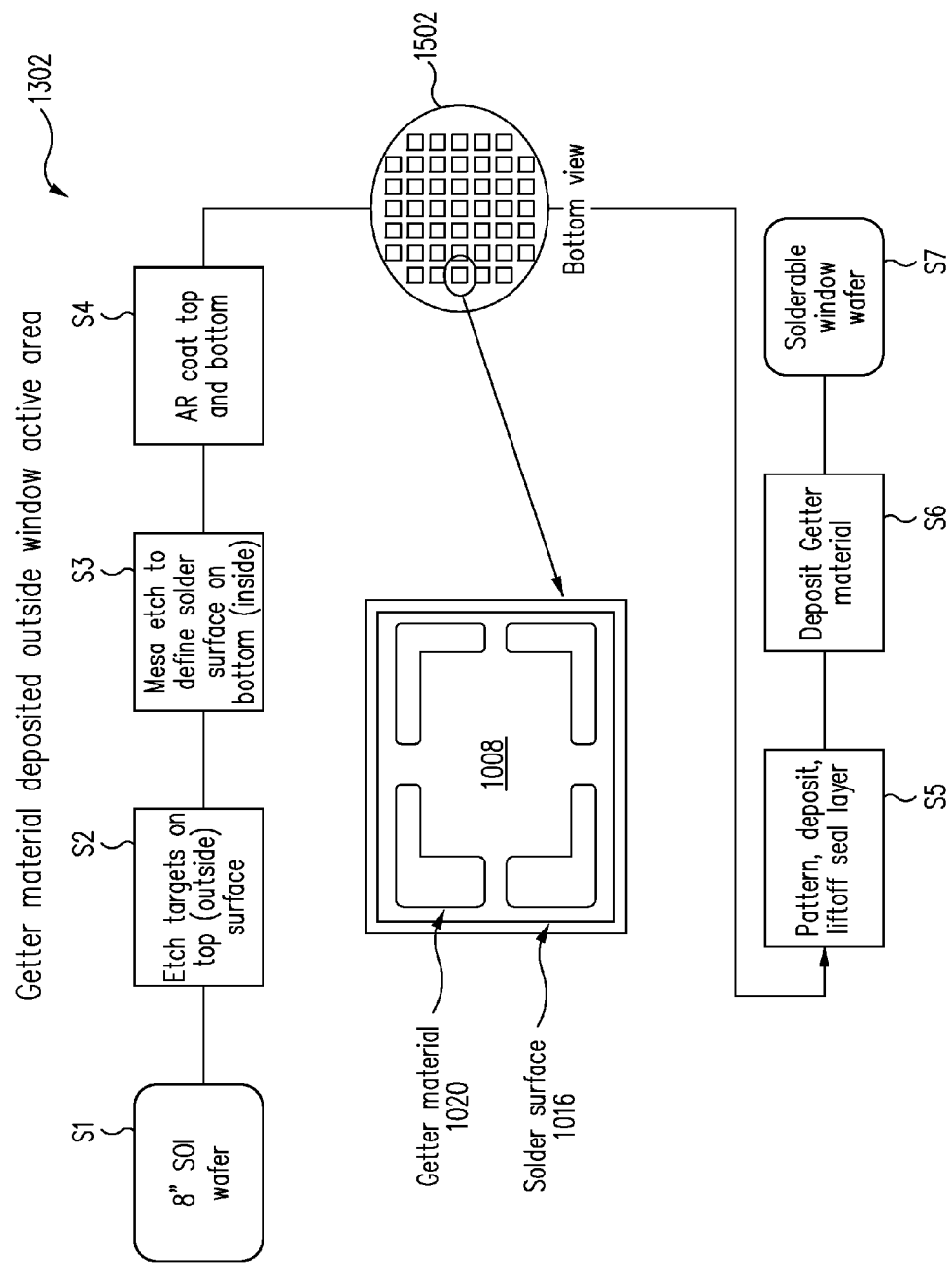
FIG. 19 is a process flow diagram of the example window wafer WLP method of FIG. 14, showing a getter deposition step of the method applied to the window wafer in accordance with an embodiment of the invention.

As illustrated in FIG. 17, the example method 1302 proceeds at S4 with the formation of antireflective coatings 1018 on the upper and lower surfaces of the windows 1008 in the window wafer 1502. As shown in FIG. 18, the example method 1302 continues at S5 with the deposition of a sealing ring 1016, which may comprise liftoff seal layers of an adhesion layer (e.g., titanium (Ti)), a barrier material (e.g., nickel), and a solder layer comprising, e.g., gold (Au) and tin (Sn). As illustrated in FIG. 19, the example method 1302 continues at S6 with the deposition of a getter material 1020 on the lower surface of each of the windows 1008 of the window wafer 1502, and concludes at S7 with a solderable window wafer 1502 that is ready for assembly with a corresponding bolometer wafer, as discussed in more detail below.

As discussed above in connection with FIG. 13, the example WLP method 1102 comprises two methods, viz., a "window wafer" production method 1302 and a "bolometer wafer" production method 1304, that merge into a third "wafer assembly and bonding" method 1306.

Figure 20:
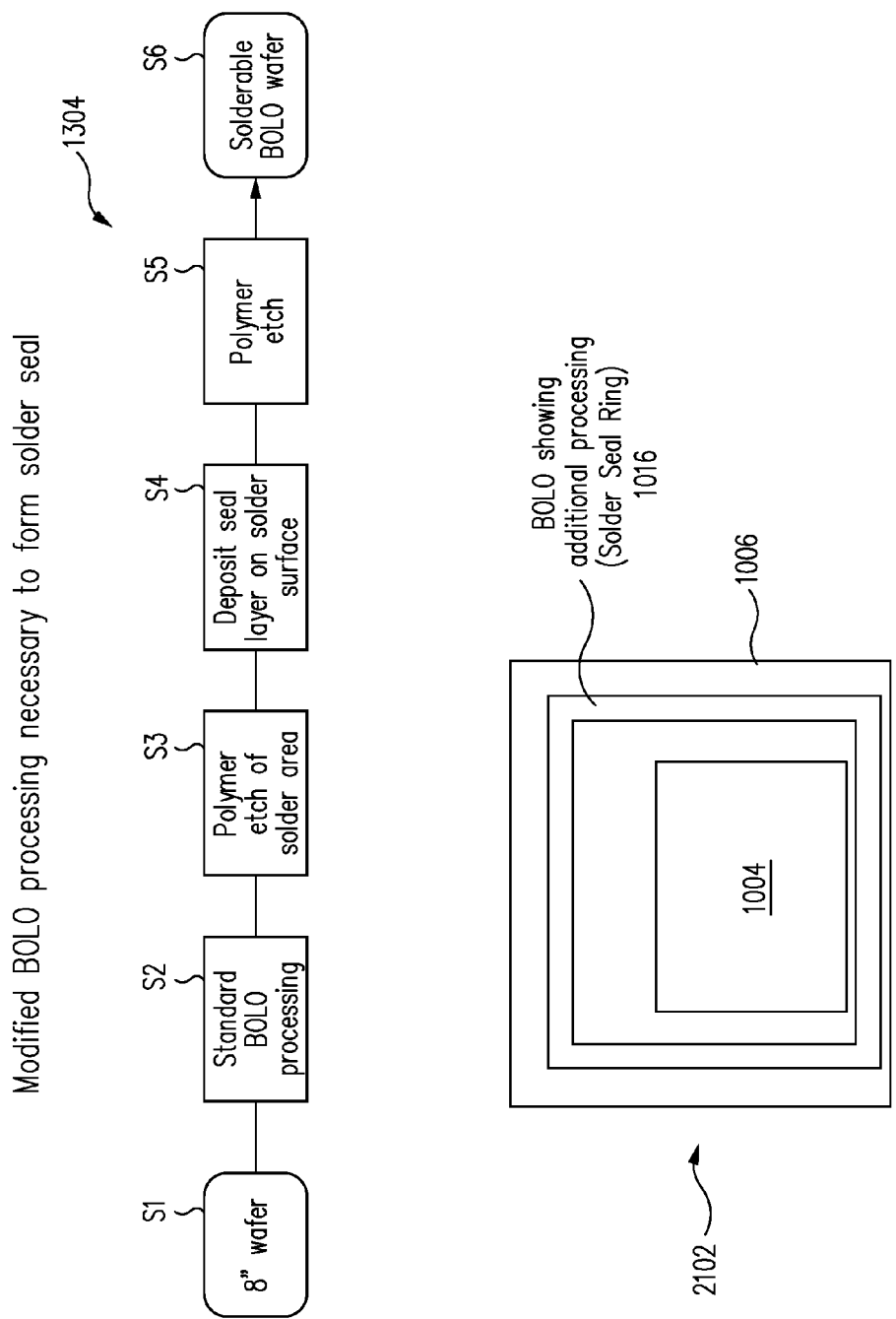
FIG. 20 is a process flow diagram of an example embodiment of a WLP method for producing a bolometer wafer in accordance with an embodiment of the invention.
Figure 21:
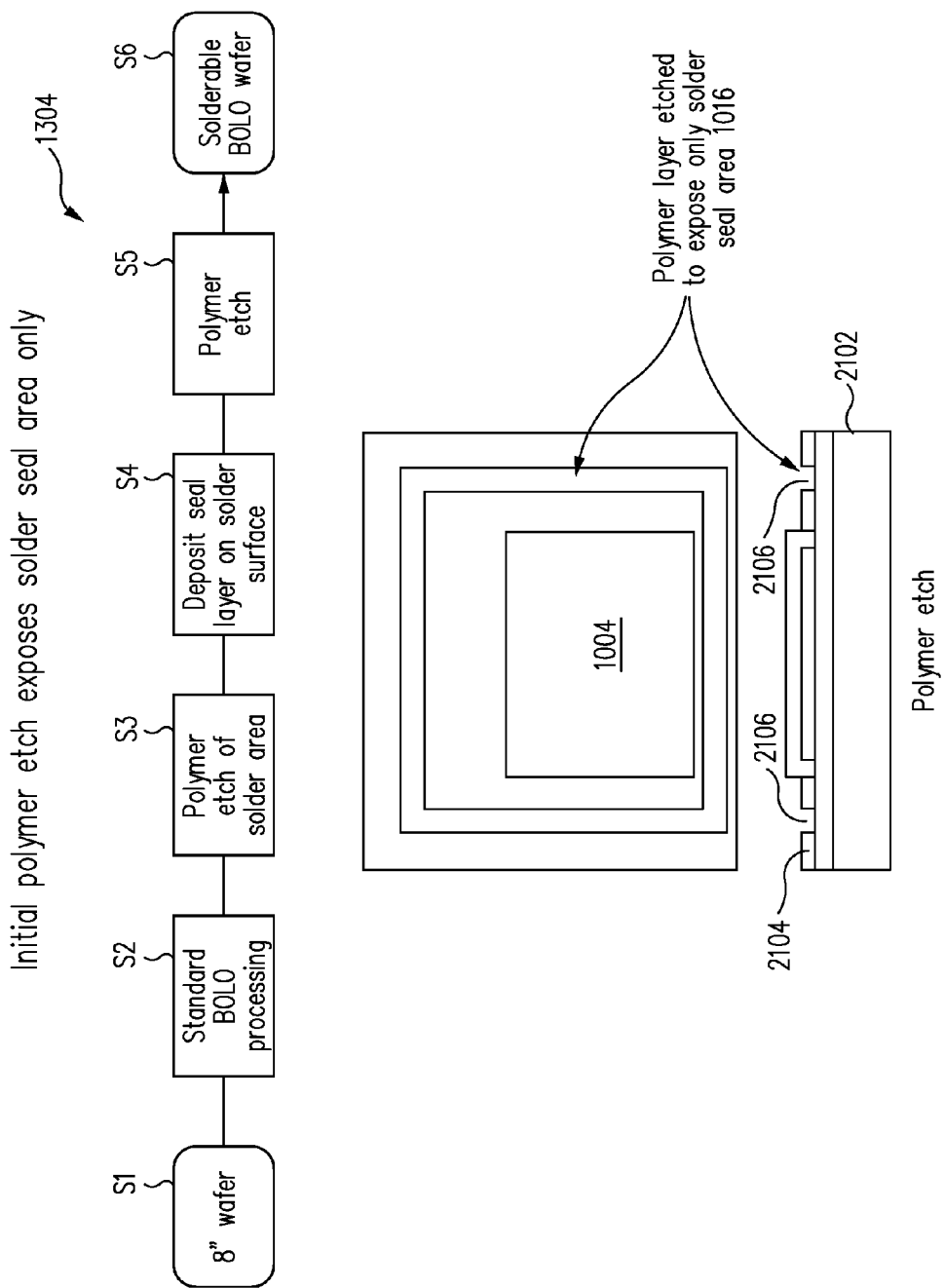
FIG. 21 is a process flow diagram of the example bolometer wafer WLP method of FIG. 20, showing a solder seal etching step of the method applied to the bolometer wafer in accordance with an embodiment of the invention.

FIG. 20 illustrates some more of the details of the bolometer wafer production method 1304, which begins at Si with the provision of wafer, e.g., of Si, and proceeds at S2 with conventional processing to produce an array of infrared detectors (e.g., microbolometers) 1004 on a surface thereof to form a bolometer wafer 2102 (see FIG. 21). Up to this stage, the method 1304 for producing the bolometer wafer 2102 is relatively conventional. However, as illustrated in FIG. 20, after this stage or if desired at an earlier stage, it is desirable to form a solder sealing ring 1016 on the surface of the bolometer wafer 2102 around each of the microbolometer arrays 1004 thereon for effecting a sealing bond with the window wafer 1502, as described below.

Figure 22:
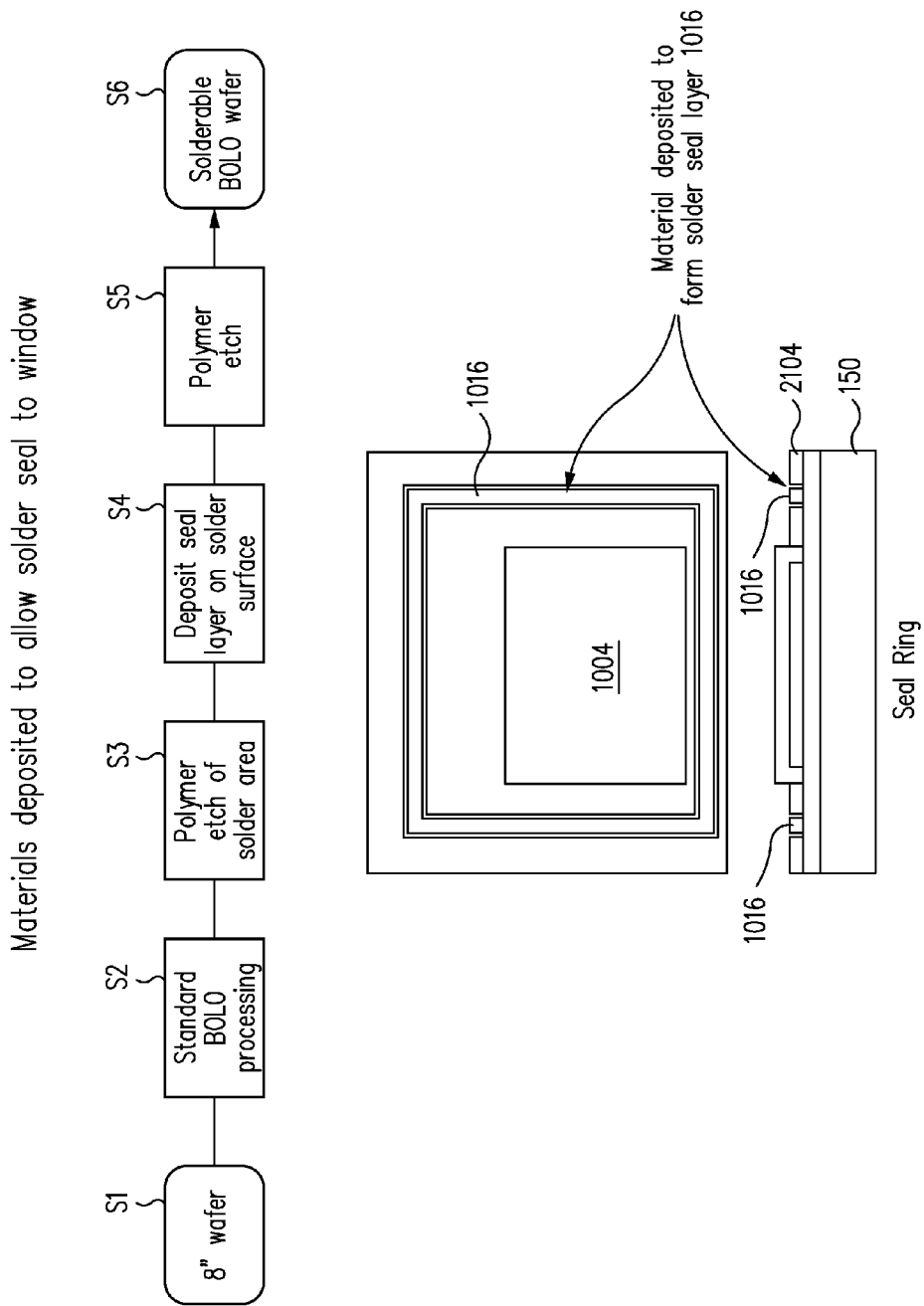
FIG. 22 is a process flow diagram of the example bolometer wafer WLP method of FIG. 20, showing a solder seal deposition step of the method applied to the bolometer wafer in accordance with an embodiment of the invention.
Figure 23:
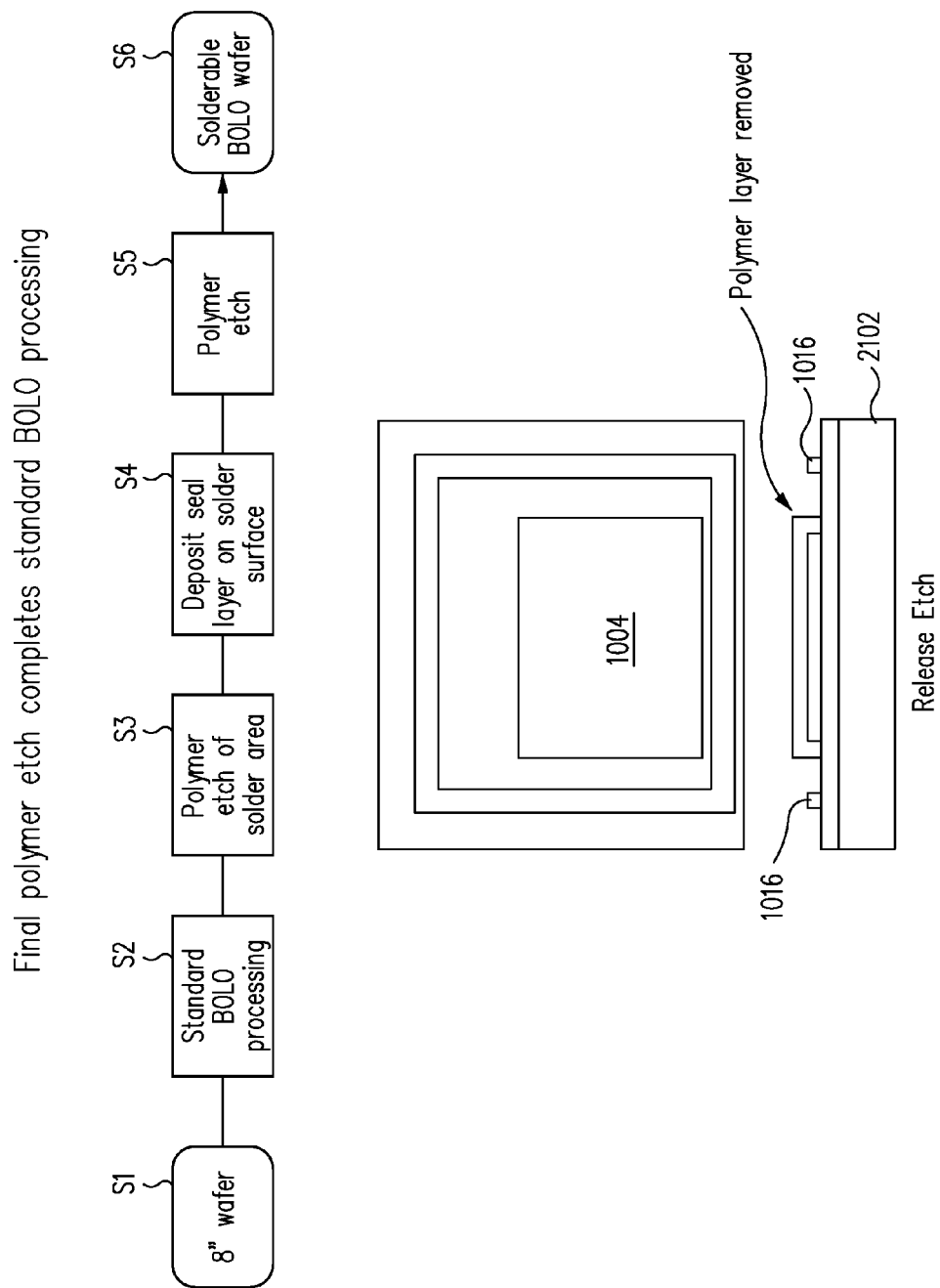
FIG. 23 is a process flow diagram of the example bolometer wafer WLP method of FIG. 20, showing an etching step of the method applied to the bolometer wafer in accordance with an embodiment of the invention.

Accordingly, as illustrated in FIG. 21, at S3 of the example bolometer wafer production method 1304, in one embodiment, a layer of a polymer 2104 is etched using, e.g., photolithography techniques, to form a trench 2106 in the layer 2104 around each of the microbolometer arrays 1004 of the wafer 2102. Then, as illustrated in FIG. 22, at S4 of the example method 1304, a sealing ring material is deposited (e.g., using conventional liftoff photolithography techniques) in the trenches 2106 of the polymer layer 2104 to form sealing rings 1016 therein. As illustrated in FIG. 23, following the deposition of the sealing ring 1016 material, the polymer layer 2104 is removed from the wafer 2102, e.g., by etching, to conclude the method 1304 at S7 with a solderable bolometer wafer 2102 that is ready for assembly with a corresponding window wafer 1502, as discussed in more detail be low.

Figure 24:
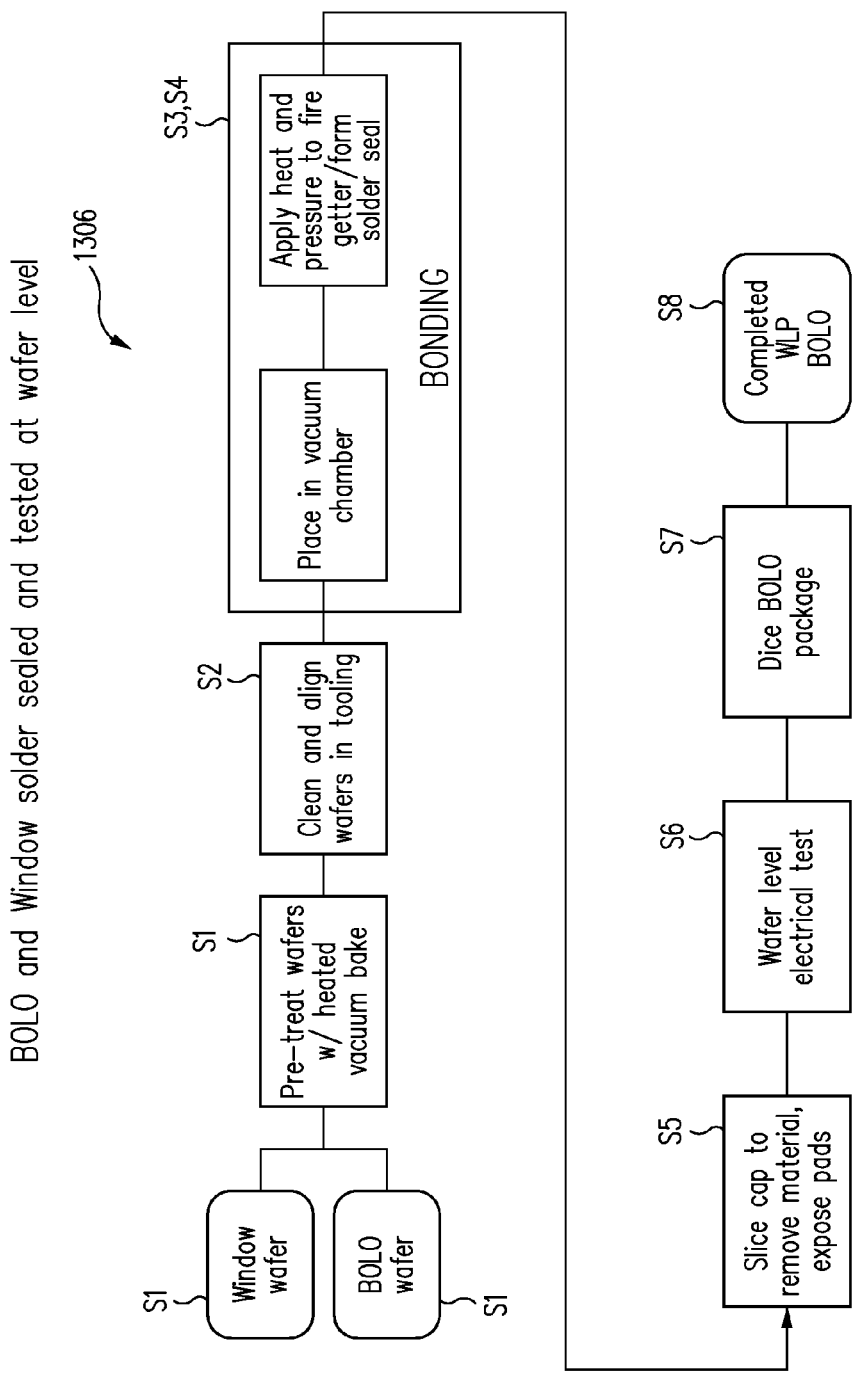
FIG. 24 is a process flow diagram similar to FIG. 14, showing steps involved in the wafer level bonding, testing and dicing of the window wafer and the bolometer wafer in accordance with an embodiment of the invention.

As discussed above in connection with FIG. 13, the window wafer production method 1302 and the bolometer wafer production method 1304 merge into a third, wafer-assembly- and bonding method 1306. This is illustrated in FIG. 24, wherein the method 1306 begins at S1 with the provision of the window wafer 1502 produced by the example method 1302 and the bolometer wafer 2102 produced by the example method 1304 described above. The window wafer 1502 and the bolometer wafer 2102 may be pretreated with a heated vacuum bake at S1, as would be understood by one skilled in the art.

Figure 25:
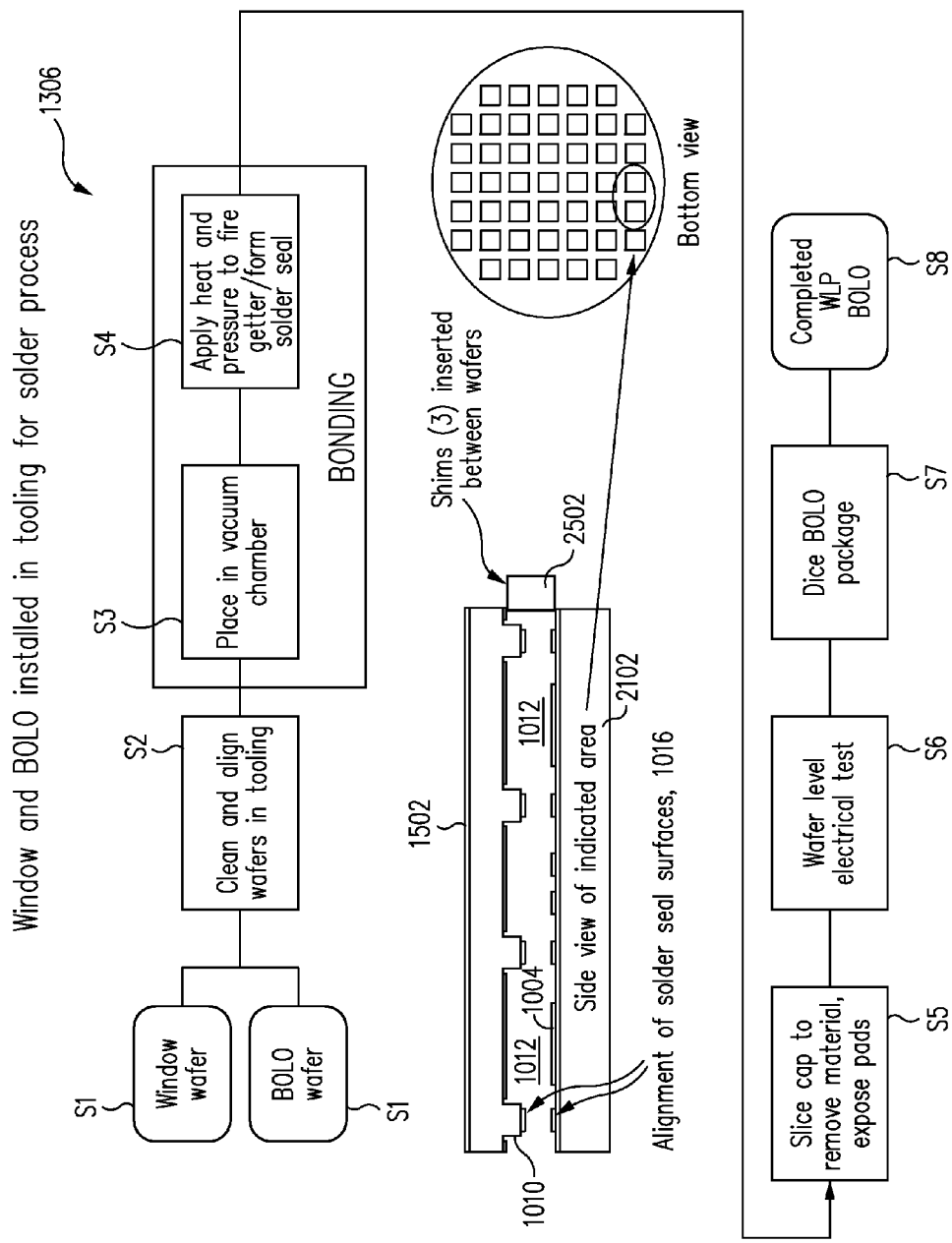
FIG. 25 is a process flow diagram of the example WLP method of FIG. 24, showing a wafer alignment etching step of the method applied to the window and bolometer wafers in accordance with an embodiment of the invention.

As illustrated in FIG. 25, the example method 1306 then proceeds at S2 with a cleaning and alignment of the two wafers 1502 and 2102 in a fixture or tool (e.g., either within or outside of vacuum chamber 2604) designed to hold them in alignment such that the window wafer 1502 is positioned above the bolometer wafer 2102, the cavities 1012 of the window wafer 1502 are respectively disposed over corresponding ones of the microbolometer arrays 1004 on the bolometer wafer 2102, and the respective solder seal rings 1016 on the mesas 1010 and the bolometer wafer 2102 are precisely aligned with each other. In this regard, the two wafers 1502 and 2102 may be spaced apart from each other using one or more optional shims 2502.

Figure 26:
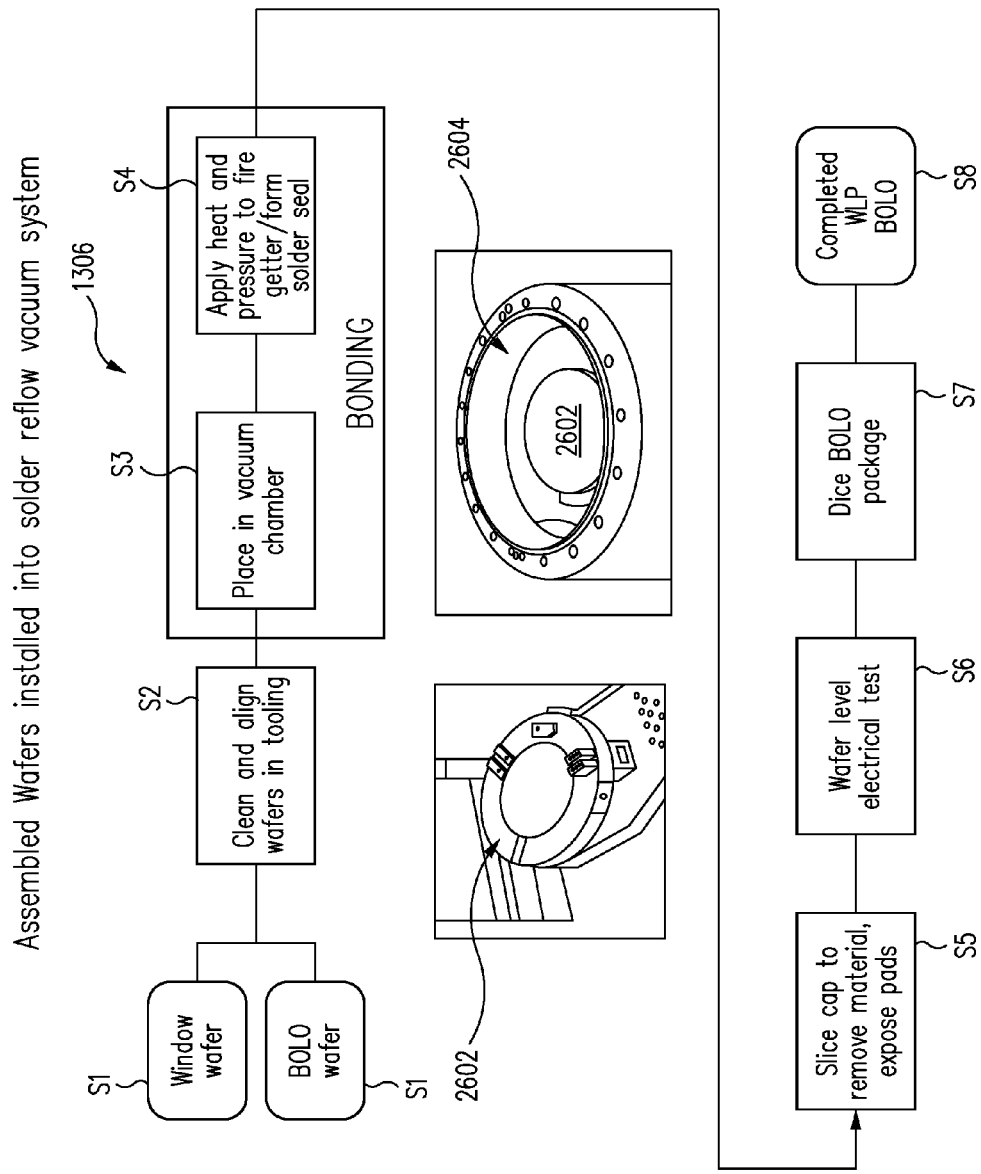
FIG. 26 is a process flow diagram of the example WLP method of FIG. 24, showing a fixtured wafer assembly insertion step of the method applied to the window and bolometer wafers in accordance with an embodiment of the invention.
Figure 27:
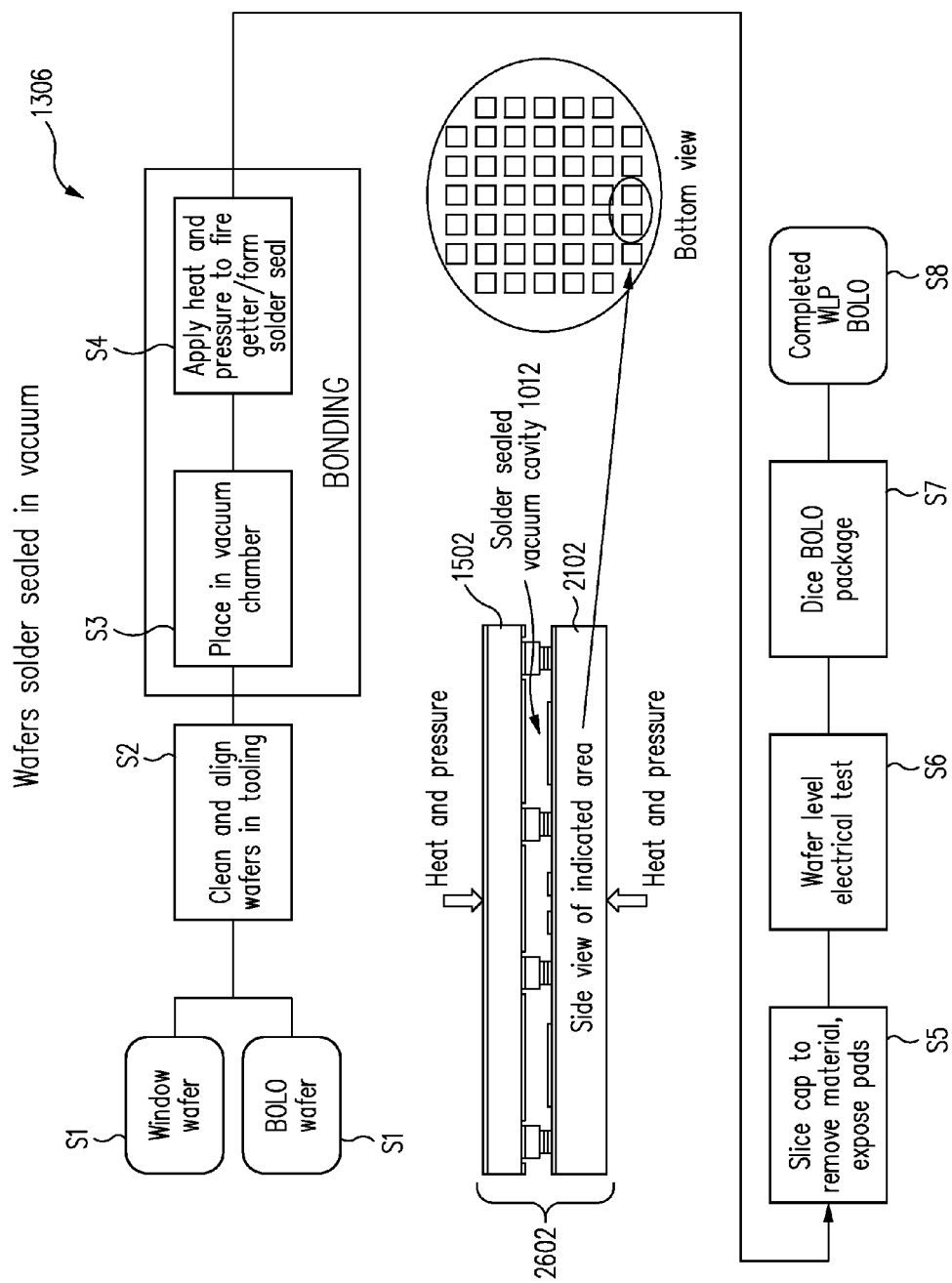
FIG. 27 is a process flow diagram of the example WLP method of FIG. 24, showing a wafer bonding step of the method applied to the window and bolometer wafers in accordance with an embodiment of the invention.

As illustrated in FIG. 26, at S3 of the example method 1306, the cleaned and fixtured assembly 2602 of wafers 1502 and 2102 is placed (or left in) in a vacuum chamber 2604, and may be subjected to certain temperature cycles and evacuation for outgassing and evacuation for cavities 1012 to prepare the VPA, as would be understood by one skilled in the art. As shown in FIG. 27, at S4 of the method 1306, the chamber 2604 is evacuated and the two wafers 1502 and 2102 are pressed together and heated (or heated and then pressed together) to a temperature sufficient to join the respective solder sealing rings 1016 on the two wafers together, thereby sealing the evacuated cavities 1012 enclosing respective ones of the microbolometer arrays 1004 against exposure to any undesirable atmospheric gasses. Additionally, in some embodiments, the application of heat to the wafer assembly 2602 may used to "fire," i.e., activate, the getters 1020 in the cavities 1012 such that they function to adsorb any air molecules or other undesired gasses that might remain in the cavities 1012 before, during, and/or after they are vacuum sealed. The getters 1020 may also be activated by application of a current or other type of trigger to activate, as would be understood by one skilled in the art.

Figure 28:
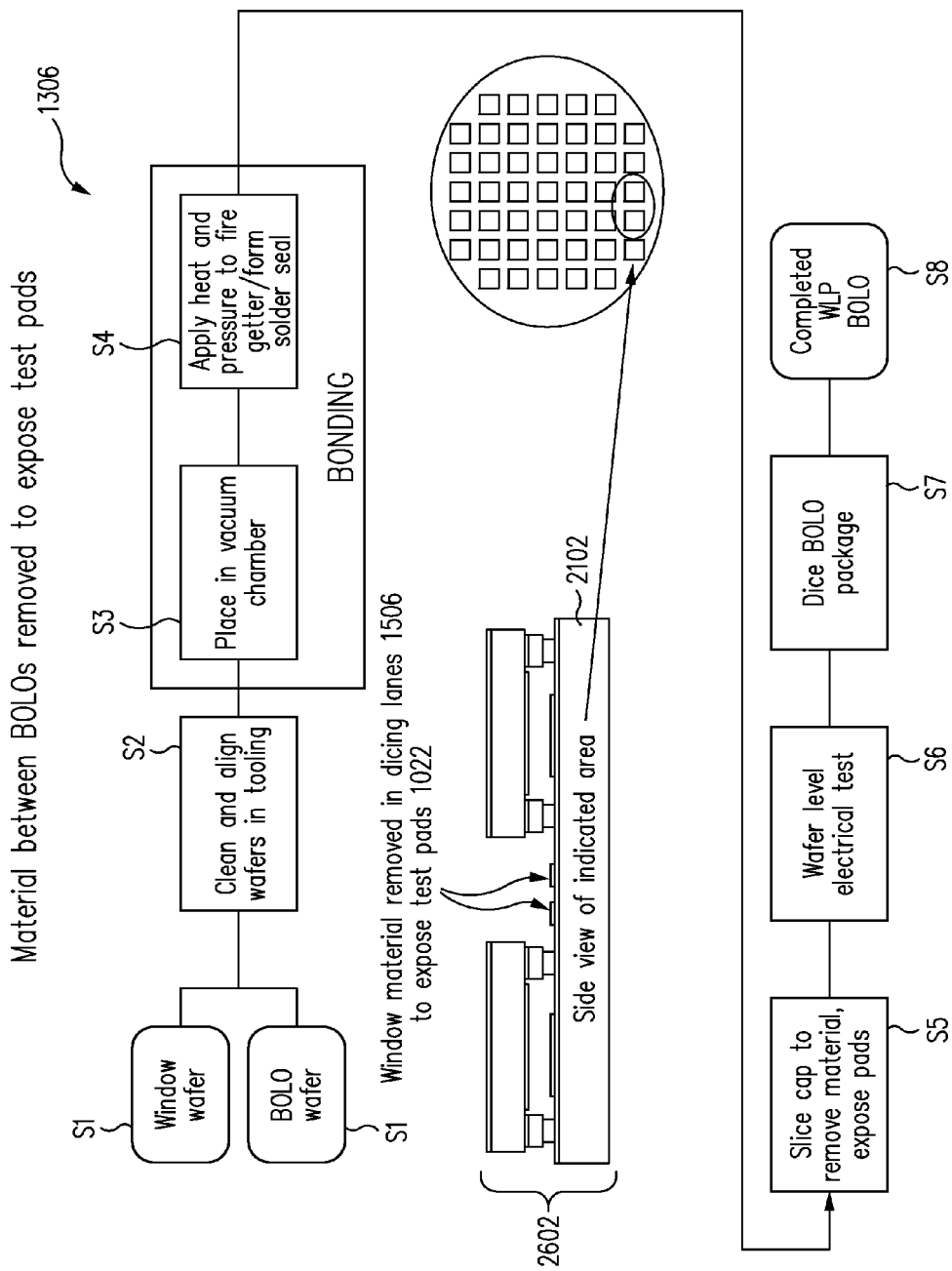
FIG. 28 is a process flow diagram of the example WLP method of FIG. 24, showing a wafer slicing step of the method applied to the window wafer in accordance with an embodiment of the invention.
Figure 29:
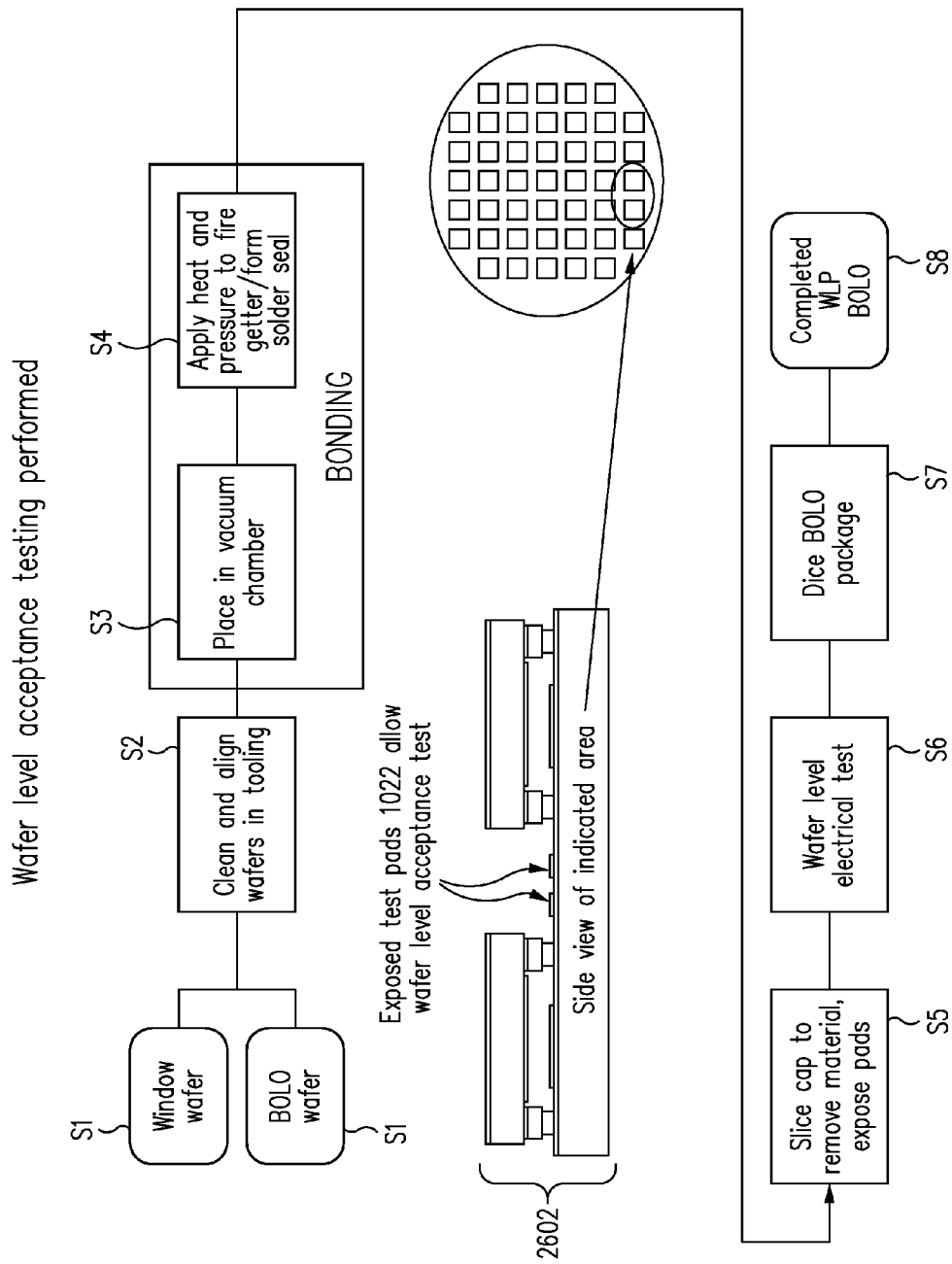
FIG. 29 is a process flow diagram of the example WLP method of FIG. 24, showing a wafer level bolometer testing step of the method applied to the window and bolometer wafers in accordance with an embodiment of the invention.

As illustrated in FIG. 28, the example method 1306 proceeds at S5 with slicing through the dicing lanes 1506 so as to expose the underlying test pads 1022 on the upper surface of the bolometer wafer 2102, and as shown in FIG. 29, at S6, may effect a wafer level electrical test of some or all of the infrared detectors 102 in the wafer assembly 2602 using, e.g., a probe card, before they are singulated from the wafer assembly 2602.

Figure 30:
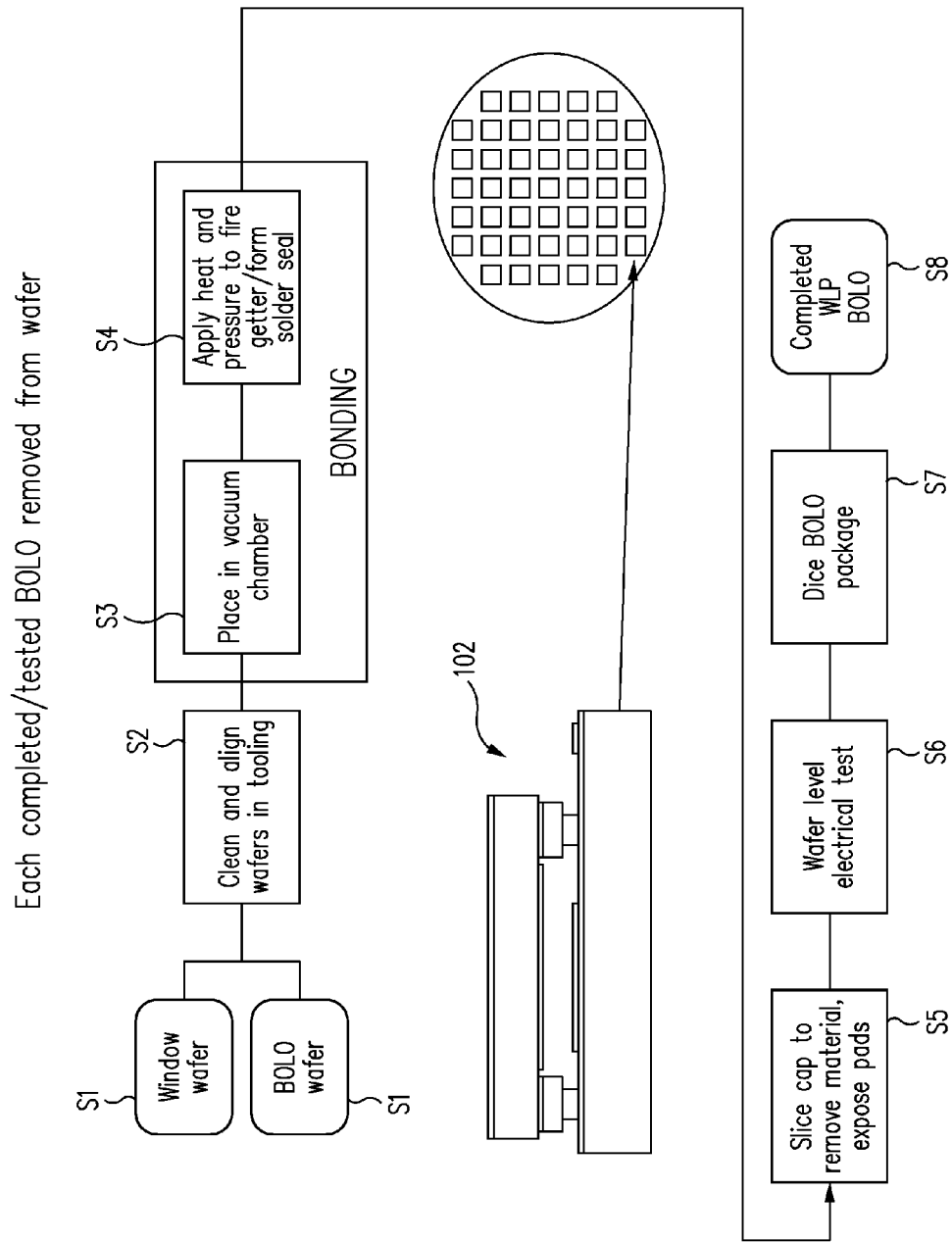
FIG. 30 is a process flow diagram of the example WLP method of FIG. 24, showing a wafer dicing step of the method applied to the bolometer wafer in accordance with an embodiment of the invention.

As illustrated in FIG. 30, after any wafer level electrical testing of the wafer assembly 2602 has been concluded, the method 1306 proceeds at S7 with the dicing of the individual infrared detectors 102 from the wafer assembly 2602, e.g., by slicing through the dicing lanes 1506 of the bolometer wafer 2102 (e.g., between test pads 1022 of adjacent infrared detectors 102), and concludes at S8 with a plurality of completed infrared detectors 102.

Figure 31:
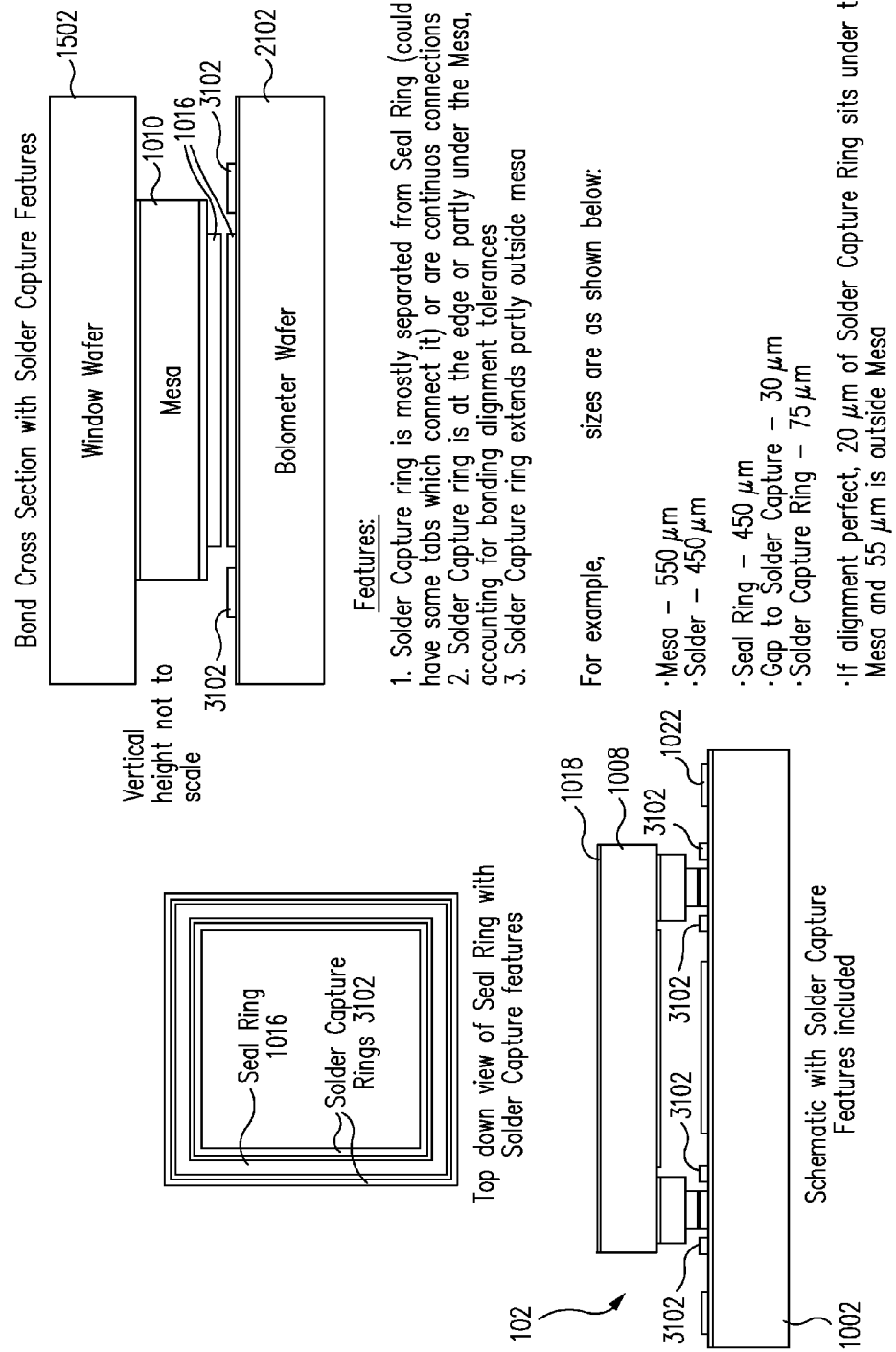
FIG. 31 is a schematic diagram illustrating features of an example sealing ring and solder capture ring of an infrared detector in accordance with an embodiment of the invention; and, FIGS. 32A-32H are schematic partial cross-sectional side elevation views of a vacuum bonding chamber and wafer assembly, respectively showing sequential steps involved in an example WLP process for bonding the wafer assembly in accordance with an embodiment of the invention.

FIG. 31 is a diagram illustrating features and example dimensional details of an example solder sealing ring 1016 and optional solder capture rings 3102 of an example infrared detector 102 in accordance with an embodiment of the invention. As illustrated in FIG. 31, at least one solder capture ring 3102 may be formed on the substrate 1002 adjacent to the solder sealing ring 1016 (or formed as part of solder sealing ring 1016), and may function during the wafer assembly 2602 bonding process described above to prevent excess solder from flowing away from the bonding joint effected between the respective sealing rings 1016 of the window wafer 1502 and the bolometer wafer 2102 and onto the surface of the microbolometers 1004. For example for an embodiment, solder capture ring 3102 may be formed along solder sealing ring 1016 with solder connections to (e.g., periodically) to solder sealing ring 1016.

Figure 32A:
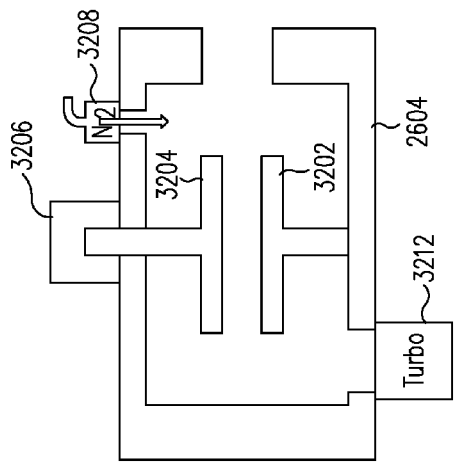

FIGS. 32A-32H are schematic partial cross-sectional side elevation views of a vacuum bonding chamber 2604 and fixtured wafer assembly 2602, respectively showing sequential steps involved in an example WLP process for bonding the wafer assembly 2602, as described above in connection with FIGS. 24-27, for one or more embodiments. As illustrated in FIG. 32A, the vacuum chamber 2604 may include a fixed press platen 3202, a press platen 3204 that is moveable relative to the fixed press platen 3202 by means of, e.g., a hydraulic motor 3206, a source 3208 of a neutral gas, e.g., nitrogen ($N_2$), for purging the chamber 2604 of air, a chamber door 3210 that may be closed and sealed against a high pressure vacuum, and a pump 3212 for forming a relatively hard vacuum in the chamber 2604.

Figure 32B:
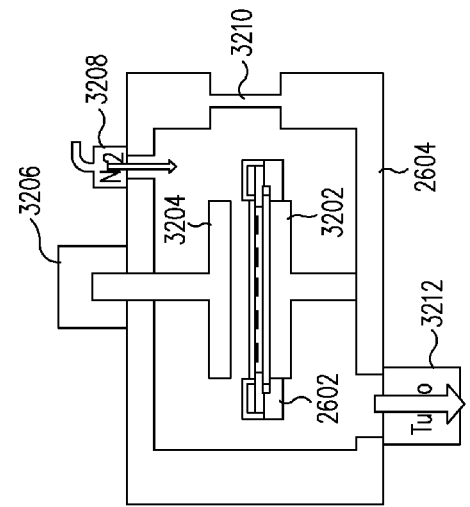
Figure 32C:
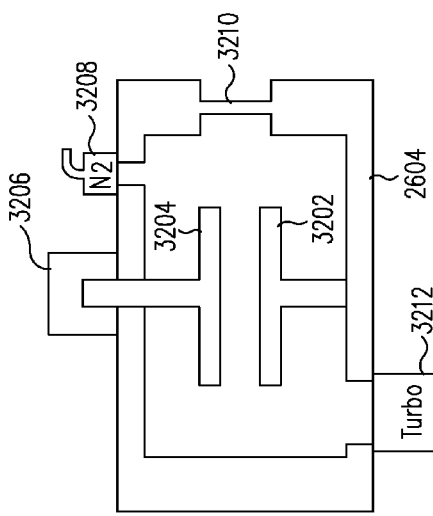
Figure 32D:
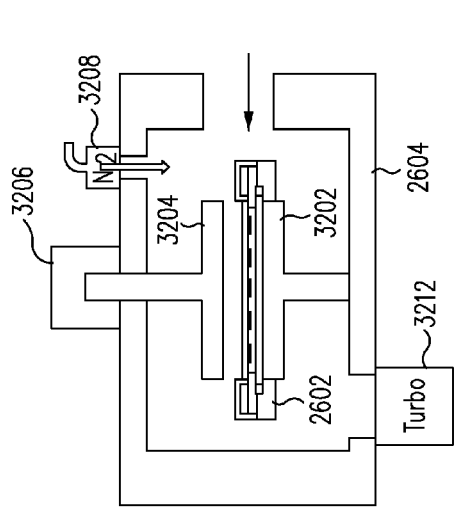
Figure 32E:
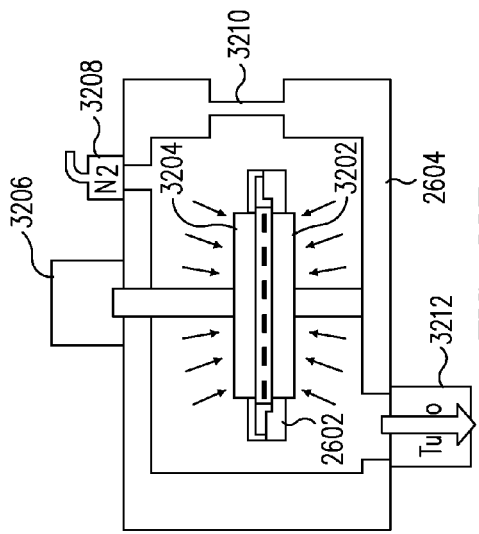

As illustrated in FIG. 32A, the example bonding process may begin with venting the chamber with $N_2$ using the $N_2$ source 3208, then opening the chamber door 3210 (FIG. 32B). In FIG. 32C, the fixtured wafer assembly 2602 is inserted into the chamber 2604 and between the two press platens 3202 and 3204. In FIG. 32D, the door 3210 of the chamber 2604 is closed, and the chamber 2604 is pumped out using the pump 3212, purged using the purging source 3208, then pumped out again using the pump 3212 to form a relatively hard vacuum in the chamber 2604. In FIG. 32E, the press platens 3202 and 3204 are brought in contact with the fixtured wafer assembly 2602 using the motor 3206, and the two press platens 3202 and 3404 are heated, e.g., with internal heating elements, to an elevated temperature to bake the fixtured wafer assembly 2602 in preparation to bonding the two wafers 1502 and 2102 together, as described above.

Figure 32F:
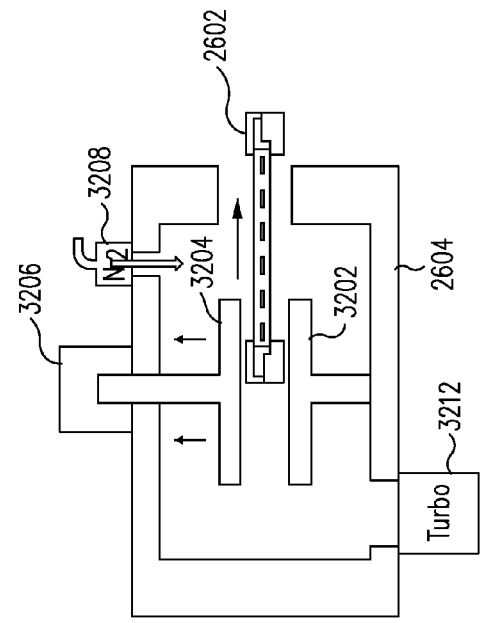
Figure 32G:
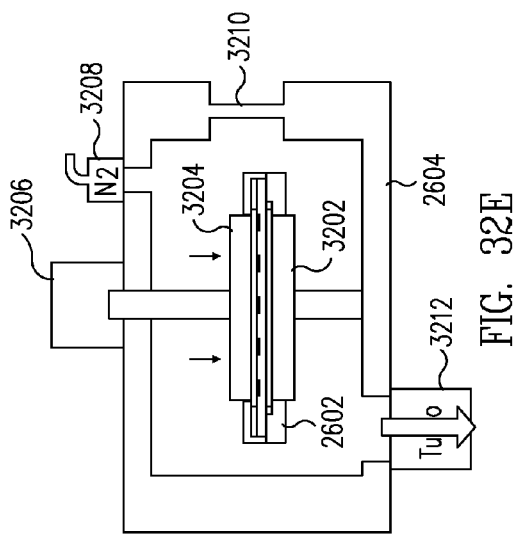
Figure 32H:
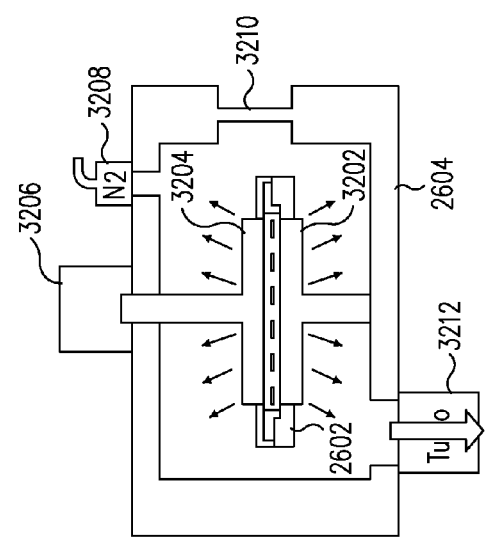

In FIG. 32F, a pressing force is applied to the fixtured wafer assembly 2602 by the press platens 3202 and 3204, and the temperature of the two press platens 3202 and 3404 is then ramped up to the melting temperature of the solder sealing rings 1016 of the two wafers 1502 and 2102, causing them to fuse together and seal a vacuum within each of the cavities 1012 of the wafer assembly 2602, as described above. In FIG. 32G, the press platens 3202 and 3204, together with the fixtured wafer assembly 2602, are allowed to cool to a temperature below the melting temperature of the solder sealing rings 1016, and in FIG. 32H, the chamber 2604 is vented using the purging source 3208, the press platen 3202 and 3204 are moved apart to relieve the force applied by them to the wafer assembly 2602, the door 3210 of the chamber 2604 is opened, and the fixtured and wafer assembly 2602, now bonded together, is removed from the chamber 2604 for subsequent post-bonding processing, for example, as discussed above in connection with FIGS. 28-30.

Systems and methods are disclosed herein to provide infrared camera architectures and infrared detectors in accordance with one or more embodiments of the invention. For example, in accordance with an embodiment of the invention, an infrared camera architecture is disclosed that integrates the entire IR camera electronics, thermal management, and optical alignment functionality into a single component (e.g., a single package or chip core). The infrared camera architecture, for example, may represent an easy to design-in electronic component for device and system applications. Techniques are also disclosed to manufacture the infrared detector based on WLP techniques in accordance with one or more embodiments.

The infrared camera architectures disclosed herein may provide certain advantages over conventional infrared camera architectures. For example, the techniques disclosed herein for one or more embodiments of the invention may provide for greater miniaturization of the infrared camera and at reduced manufacturing costs and allow for higher volume production. The infrared camera architectures may reduce the number of external circuit boards, components, heat sinks, packages, and additional electronic circuitry and power supply voltages that would conventionally be required to create and support the infrared camera. The infrared camera architectures further may reduce, simplify, or eliminate complex calibration procedures, thermal management, and optical alignment requirements and thus, provide an infrared camera that may be easily incorporated into and supported for a desired application.

While the invention has been described in detail in connection with only a limited number of embodiments of the invention, it should be readily understood that the invention is not limited to such disclosed embodiments. Rather, the invention may be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims and functional equivalents thereof.

What is claimed is:

1. An infrared detector, comprising:
    a substrate having an array of infrared detectors and a readout integrated circuit interconnected with the array disposed on an upper surface thereof;
    a generally planar window spaced above the array, the window being substantially transparent to infrared light;
    a mesa bonded to the window and to the substrate, the mesa having closed marginal side walls disposed between an outer periphery of a lower surface of the window and an outer periphery of the upper surface of the substrate and defining a closed cavity between the window and the substrate that encloses the array, and wherein an upper surface of the side walls of the mesa are bonded to the lower surface of the window by a layer of oxide of the semiconductor, and a lower surface of the side walls of the mesa are bonded to the substrate; and,
    a solder seal bonding the mesa to the substrate so as to seal the cavity.

2. The infrared detector of claim 1, wherein the mesa and the window comprise a semiconductor.

3. The infrared detector of claim 2, wherein the lower surface of the side walls of the mesa are bonded to the upper surface of the substrate by a ring of solder to form the solder seal, and wherein the array of infrared detectors comprise an array of microbolometers.

4. The infrared detector of claim 3, wherein at least one of the mesa, the substrate and the window comprises silicon.

5. The infrared detector of claim 3, further comprising at least one solder capture ring disposed on the substrate adjacent to the ring of solder.

6. The infrared detector of claim 1, further comprising at least one getter disposed on a lower surface of the window.

7. The infrared detector of claim 1, further comprising at least one anti-reflective coating disposed on an upper and/or a lower surface of the window.

8. The infrared detector of claim 1, further comprising at least one electrical test pad disposed on the upper surface of the substrate adjacent to the outer periphery of the window and coupled to the readout integrated circuit.

9. The infrared detector of claim 1, wherein the mesa and the window comprise a semiconductor, wherein an upper surface of the side walls of the mesa are bonded to the lower surface of the window by a layer of oxide of the semiconductor, and wherein the cavity and a lower surface of the window is formed using a Deep Reactive Ion Etching (DRIE) process followed by a hydrofluoric acid etch to remove the oxide across a portion of the window.

10. The infrared detector of claim 1, wherein the detector comprises one of a plurality of infrared detectors singulated from a bonded sandwich of a window wafer and a bolometer wafer, and wherein the infrared detector is part of an infrared camera.

11. A method for making an infrared detector, the method comprising:
   providing a window wafer having a layer of oxide sandwiched between two layers of a semiconductor;
   forming an array of cavities in a surface of the window wafer, each cavity defining a window substantially transparent to infrared light and surrounded by a mesa having closed marginal side walls, wherein upper surfaces of the side walls of the mesa are bonded to a lower surface of the window wafer by a layer of oxide of the semiconductor, adjacent rows and columns of the array being separated from each other by dicing lanes;
   providing a detector wafer having an upper surface with an array of infrared detector arrays corresponding in size and location to be disposed within the array of cavities in the window wafer, and a corresponding array of readout integrated circuits respectively interconnected with associated ones of the infrared detector arrays disposed thereon, adjacent rows and columns of the infrared detector array being separated from each other by dicing lanes;
   aligning the window wafer over the detector wafer such that the cavities of the window wafer are respectively disposed over corresponding ones of the infrared detector arrays; and,
   bonding lower surfaces of the side walls of the mesas with the upper surface of the detector wafer such that each of the cavities is sealed and a plurality of infrared detectors is defined between the two wafers.

12. The method of claim 11, wherein the forming of the array of cavities comprises:
   etching the surface of the window wafer down to the oxide layer to form the array of cavities and associated mesas, and;
   removing the oxide layer from the surface of the window wafer in such a way that lower surfaces of the windows remain substantially smooth and planar while the respective marginal side walls of each of the mesas remain bonded to the window wafer by the layer of oxide.

13. The method of claim 12, wherein the etching of each of the mesas comprises using a Deep Reactive Ion Etching (DRIE) process, and wherein the removing the oxide layer comprises a hydrofluoric acid etch process.

14. The method of claim 11, wherein the bonding comprises:
   forming a solder ring on a lower surface of each of the mesas;
   forming an array of solder rings on the upper surface of the detector wafer respectively corresponding in size and location to the solder rings on the mesas on the window wafer;
   evacuating at least partially each of the cavities; and,
   fusing the solder rings on the mesas with corresponding ones of the solder rings on the upper surface of the detector wafer.

15. The method of claim 14, wherein the array of solder rings are formed on the upper surface of the detector wafer utilizing photolithography techniques.

16. The method of claim 14, further comprising forming at least one solder capture ring on the detector wafer adjacent to each of the solder rings thereon.

17. The method of claim 11, further comprising forming an anti-reflective coating on at least one of an upper and a lower surface of each of the windows.

18. The method of claim 11, further comprising:
   forming a getter on a lower surface of each of the windows; and,
   firing the getters during the bonding of the wafers.

19. The method of claim 11, further comprising:
   slicing through the dicing lanes of the window wafer to expose test pads on the upper surface of the detector wafer; and,
   performing a wafer level test of at least some of the plurality of infrared detectors using the exposed test pads.

20. The method of claim 11, further comprising slicing through the dicing lanes of the detector wafer to singulate the plurality of infrared detectors therefrom.

* * * * *